US010930365B2

United States Patent
Poliakov et al.

(10) Patent No.: US 10,930,365 B2
(45) Date of Patent: Feb. 23, 2021

(54) ARTIFICIAL INTELLIGENCE BASED MONITORING OF SOLID STATE DRIVES AND DUAL IN-LINE MEMORY MODULES

(71) Applicant: Intel Corporation, Santa Clara, CA (US)

(72) Inventors: Pavel Poliakov, Cameron Park, CA (US); Andrey Kudryavtsev, Mather, CA (US); Shekoufeh Qawami, El Dorado Hills, CA (US); Amirali Khatib Zadeh, Beaverton, OR (US); Monte Klinkenborg, Placerville, CA (US)

(73) Assignee: Intel Corporation, Santa Clara, CA (US)

( * ) Notice: Subject to any disclaimer, the term of this patent is extended or adjusted under 35 U.S.C. 154(b) by 8 days.

(21) Appl. No.: 16/281,559

(22) Filed: Feb. 21, 2019

(65) Prior Publication Data
US 2019/0189236 A1   Jun. 20, 2019

(51) Int. Cl.
*G11C 29/00* (2006.01)
*G11C 29/38* (2006.01)
(Continued)

(52) U.S. Cl.
CPC .............. *G11C 29/38* (2013.01); *G06N 3/04* (2013.01); *G06N 3/08* (2013.01); *G11C 11/54* (2013.01);
(Continued)

(58) Field of Classification Search
CPC ....... G11C 29/38; G11C 11/54; G11C 16/349; G11C 29/56016; G11C 29/006;
(Continued)

(56) References Cited

U.S. PATENT DOCUMENTS 7,778,077 B2    8/2010 Gorobets et al.
2003/0074611 A1*  4/2003 Nachumovsky ..... G11C 29/006
                                                              714/718
(Continued)

FOREIGN PATENT DOCUMENTS

EP            1321896 A2 *  6/2003  ........... G06T 3/4046

OTHER PUBLICATIONS

Non-Final Office Action dated Feb. 14, 2020 for U.S. Appl. No. 16/112,574, 20 pages.
(Continued)

*Primary Examiner* — Albert Decady
*Assistant Examiner* — Osman M Alshack
(74) *Attorney, Agent, or Firm* — Schwabe, Williamson & Wyatt, P.C.

(57) ABSTRACT

In embodiments, a memory controller (MC) includes an output interface, and an execution engine (EE) to identify, based on field test results of a die coupled to the MC, initial test results of the die using an artificial neural network (ANN) trained to identify the die from a set of NVM dies based on initial test results of the set of NVM dies obtained at a time of manufacture of the set of dies. The initial test results include a first useful life prediction and the field test results include a second useful life prediction, and the initial test results are regenerated by the ANN to protect their confidentiality. In embodiments, the MC is further to compare the second useful life prediction with the first useful life prediction, to determine a deviation between the two, and output, via the output interface, the deviation to a user.

19 Claims, 13 Drawing Sheets

(51) Int. Cl.
*G11C 29/44* (2006.01)
*G06N 3/08* (2006.01)
*G06N 3/04* (2006.01)
*G11C 11/54* (2006.01)
*G11C 16/34* (2006.01)
*G11C 29/56* (2006.01)
*G11C 29/04* (2006.01)

(52) U.S. Cl.
CPC .......... *G11C 16/349* (2013.01); *G11C 29/006* (2013.01); *G11C 29/44* (2013.01); *G11C 29/56008* (2013.01); *G11C 29/56016* (2013.01); *G11C 2029/0403* (2013.01); *G11C 2029/5604* (2013.01)

(58) Field of Classification Search
CPC .............. G11C 29/56008; G11C 29/44; G11C 2029/0403; G11C 2029/5604; G06N 3/08; G06N 3/04; G06F 3/06
USPC ........................................................ 714/719
See application file for complete search history.

(56) References Cited

U.S. PATENT DOCUMENTS

| 2006/0245248 | A1* | 11/2006 | Hu ..................... G11C 16/3495 365/185.09 |
| 2014/0181363 | A1* | 6/2014 | Hoang ................... G11C 16/22 711/103 |
| 2015/0371132 | A1* | 12/2015 | Gemello ........... H01L 21/28132 706/20 |
| 2018/0174658 | A1 | 6/2018 | Kikuchi |
| 2019/0042480 | A1* | 2/2019 | Khatib Zadeh ..... G06F 12/1458 |
| 2019/0043602 | A1* | 2/2019 | Poliakov ................ G11C 29/44 |
| 2019/0243771 | A1* | 8/2019 | Mittal ................. G06F 12/0877 |
| 2019/0278498 | A1 | 9/2019 | Dedrick |

OTHER PUBLICATIONS

Extended European Search Report dated Jul. 28, 2020 for EP Application No. 20154190.1, 5 pages.

* cited by examiner

ARTIFICIAL INTELLIGENCE BASED MONITORING OF SOLID STATE DRIVES AND DUAL IN-LINE MEMORY MODULES

FIELD

Embodiments of the present disclosure relate performance monitoring of solid state drives (SSDs) and dual in-line memory modules (DIMMs), and in particular to artificial intelligence (AI) based analysis of nonvolatile memory (NVM) die performance to identify deviation of an in-system die response from an ideal response for the die.

BACKGROUND

Conventional wear-out management techniques used in SSDs and DIMMs provide very limited quality of service (QoS). Moreover, they do not maintain information that correlates memory array wear-out with SSD or DIMM workload at run-time. Moreover, currently, no provisioned data is stored in either SSD or DIMM systems. As a result, SSD/DIMM memory controllers does not execute media health check tests based on such data.

DETAILED DESCRIPTION

Figure 1:
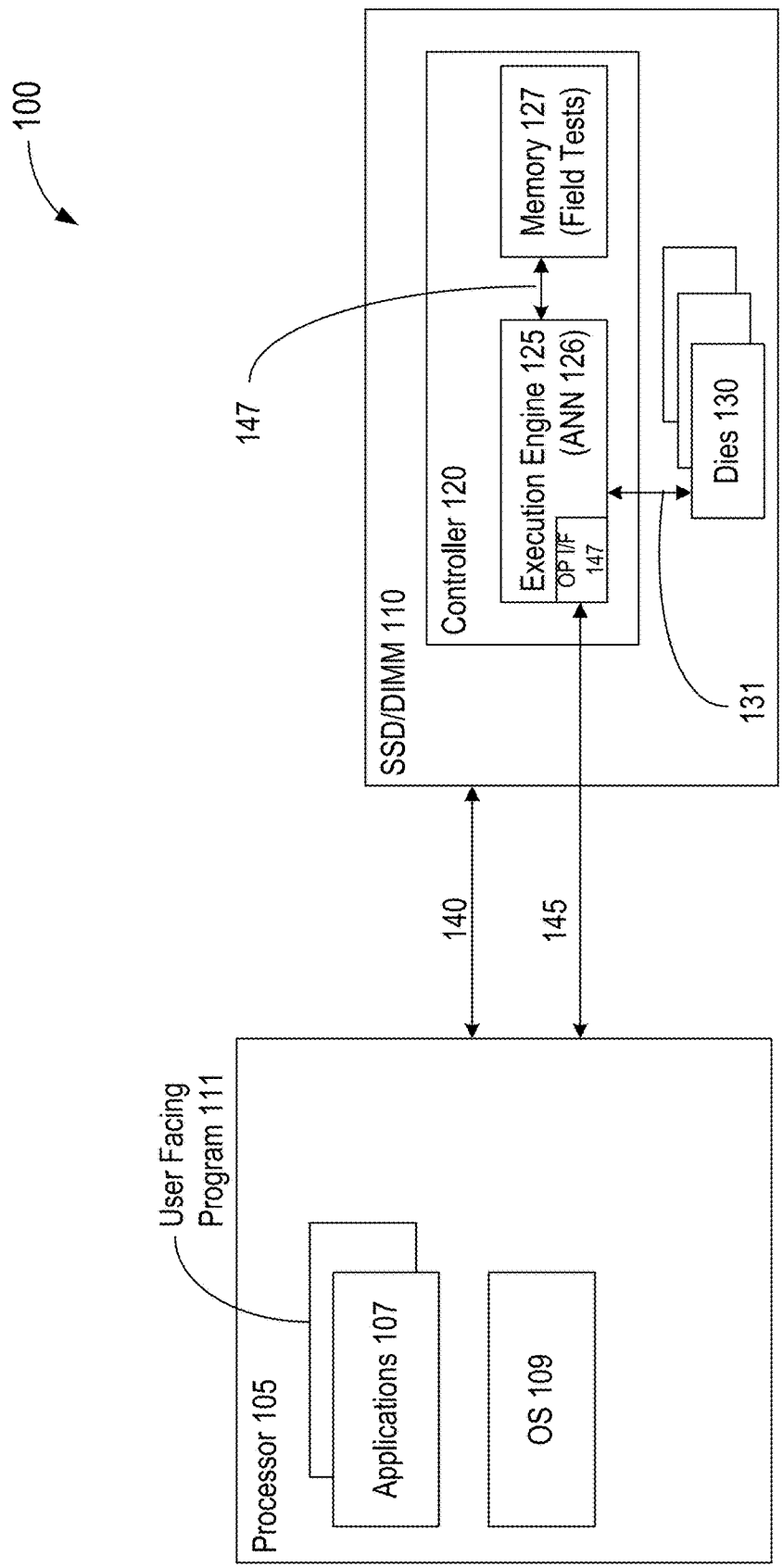
FIG. 1 illustrates a functional block diagram of a SSD die with an integrated controller provided in a computing system, in accordance with various embodiments.

In embodiments, a memory controller (MC) includes an output interface, and an execution engine (EE) to identify, based on field test results of a die coupled to the MC, initial test results of the die using an artificial neural network (ANN) trained to identify the die from a set of NVM dies based on initial test results of the set of NVM dies obtained at a time of manufacture of the set of dies. The initial test results include a first useful life prediction and the field test results include a second useful life prediction, and the initial test results are regenerated by the ANN to protect their confidentiality. In embodiments, the MC is further to compare the second useful life prediction with the first useful life prediction, to determine a deviation between the two, and output, via the output interface, the deviation to a user. In some embodiments, the MC further includes a memory coupled to the EE to store the field test results.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

As used herein, including in the claims, the term "chip" may refer to a physical integrated circuit (IC) on a computer. A chip in the context of this document may thus refer to an execution unit that can be single-core or multi-core technology.

As used herein, including in the claims, the term "processor" may refer to a logical execution unit on a physical chip. A multi-core chip may have several cores. As used herein the term "core" may refer to a logical execution unit containing an L1 (lowest level) cache and functional units. Cores are understood as being able to independently execute programs or threads.

As used herein the term "end of life response" (EOL response), refers to a prediction of useful life of a memory die, such as a NVM memory die, and an association of a combination of time in use and cumulative read/write memory cycles performed on the die with failure rates at each stage of the die's life. An EOL response may be presented, for example, as plot of failure rate versus a plot of time and cycles. Performance tests performed on a die, whether at the time of manufacture (initial tests), or at the time the die is in service in a memory module (filed tests), such as a SSD or a DIMM include an EOL response. Such performance tests may include, for example, a raw bit error rate (RBER) test.

As used herein, the terms "probe tests" and "field tests" respectively refer to performance tests performed on a NVM die at the time of manufacture, and after the die has been provided in a memory module, such as a SSD or a DIMM, and placed into operation. The probe tests may also be referred to herein as "initial tests" on the die, and their results "initial test results." Probe tests and field tests may include the RBER test, as noted above.

In embodiments, an EE is useful in, for example, 3D NAND based SSDs, and especially important for quad-level cells (QLC) based cold storage drives, due to their relatively long rebuild time. The EE's failure indicator functionality can predict a likely failure in advance, so appropriate backup and substitution may be implemented before a crisis occurs.

In embodiments, an AI assisted EE engine performs two major functions in real time operation of the SSD or DIMM. A first secured and authenticated pairing function to discover if a NVM die that is coupled to the MC and implemented in a SSD is authentic or counterfeit, and a second, a failure indication function, based on identification pf a significant deviation from an ideal response, thereby enabling a user to diagnose and actively monitor SSD/DIMM health. Moreover, in embodiments, these functions are implemented and executed securely so that proprietary technologies remain protected. In accordance with various embodiments, by performing such diagnostics on several, or all, dies in a memory module, precise measurement of homogeneity of NVM memory wear-out is thus facilitated.

In embodiments, the EE implements a fusion data algorithm (FDA) based on an ANN to perform discrete time-domain EOL recognition and estimation of a die's deviation from an ideal or desired system behavior. In some embodiments, the EE, and the ANN embodying the FDA is provided in a SSD/DIMM controller, e.g., in an ASIC. In embodiments, the ANN is trained during manufacturing, but may also be slightly tuned or adjusted by beginning of life (BOL) FT results that are run at system power-on, as described below. The FDA is so named because it fuses PT data from all dies of a memory device or module into an internal ANN structure. The dies, at the stage in manufacture when they are probe tested, are generally not yet cut out of a larger, multiple die containing, wafer. It is the data from PTs taken at this stage that are used to train the ANN. Dies in this stage of manufacture may sometimes be referred to herein as "devices under test" (DUTs) so as to distinguish them from an in-situ die as provided in a finished SSD or DIMM. Once the ANN for a SSD or DIMM is trained, it is loaded into a MC. Then, in embodiments, the MC performs in-situ FTs for security checks and for determination of a remaining lifespan, the output of such FTs including a "(remaining) health budget" and an EOL response curve from the time of the FT going forward.

Thus, in embodiments, the ANN is trained using results of PTs of the particular dies which are designated to be installed in a given SSD/DIMM. For example, when it is desired to build a SSD/DIMM with, for example, thirty-two dies of memory, then an ANN algorithm is trained off site on the PT data earlier acquired for these thirty-two dies, and the ANN is subsequently loaded it into that particular SSD's/DIMM's controller. Thus, the ANN which will ultimately be provided in the controller of that SSD/DIMM is trained to recognize all of those thirty-two dies one form the other, and monitor whether, when installed in the SSD/DIMM, the respective performance of these thirty-two dies is close to that seen in the PTs for those dies.

Conventional wear-out management techniques used in SSDs/DIMMs provide very limited quality of service (QoS). Moreover, they do not carry any information that correlates wear-out of a memory array with the SSD/DIMM workload at run-time. Also, security aspects require careful attention and extra investments. In current SSD/DIMM systems, no provisioned data is stored, and memory controllers do not perform media health check tests of the SSD/DIMM. In contrast, various embodiments described herein offer almost unlimited opportunities for media (intra-die), as well as inter-die statistical collective behavior checks, without any performance degradation or build-up materials cost increase, due to their algorithmic implementations.

In embodiments, the ANN used by the EE does not require any iterations, such as, for example, with a host processor, which significantly reduces processing time. Moreover, security of PT data is maintained, as the PT data, acquired at manufacturing testing, is not stored in the SSD/DIMM, only the weightings of the ANN nodes, which incorporate the PT data for the entire SSD or DIMM, are stored. As a result, it is not possible to regenerate or reverse engineer the PT data from the EE or its ANN. Additionally, the ANN has a small footprint. Raw estimations performed by the inventors indicate that an example actual size of the trained ANN, taking into account log-sigmoid activation functions used and 32-bit floating point operations precision, is not more than 4-5 KB of compiled executable code. Finally, collective die behavior monitoring allows for tuning of wear-out leveling to be more homogeneous. This decreases end product costs by allowing use of lower-tier memory components, as described more fully below.

FIG. 1 illustrates an example computer system 100 in accordance with various embodiments. With reference to FIG. 1, the example computer system includes processor 105, which may run one or more applications 107. In embodiments, one of applications 107 includes a user facing program 111, through which a user may view plots of data, as well as quantified deviations from an ideal plot, for one or more in-system memory dies 130 generated by controller 120. These plots allow a user to visualize failure predictions for one or more dies of SSD/DIMM 110, and may include, for example, the plots shown in FIG. 5, described more fully below.

Processor 105 may further be running operating system (OS) 109, and may be coupled to SSD/DIMM 110, over bus 140. In embodiments, SSD/DIMM 110 includes controller 120, which may take various forms. For example, as shown, controller 120 may comprise integrated circuitry on a memory module that includes a plurality of dies 130, such as an ASIC provided within a NVM SSD or a NVM DIMM. This option is illustrated in greater detail in FIG. 6, described below. Alternatively, controller 120 may be integrated within a separate memory controller (not shown) separate from SSD/DIMM 110. Still alternatively, controller 120 may be implemented as firmware in SSD/DIMM 110, for example, or in processor 105.

Continuing with reference to FIG. 1, controller 120 includes EE 125 and memory 127, the two of which may be connected via link 147. EE 125 and memory 127 may be integrated in one sub-circuit or component of a larger device, for example. EE 125 includes an ANN 126, which has been trained using the results of multiple PTs. The PTs are failure collection tests (FCTs) run on several dies 130 of SSD/DIMM 110 at the time of manufacture of the dies, before they were provided in SSD/DIMM 110. The FCTs may be raw bit error rate tests, for example. The dies, at the time of manufacture, and prior to being provided in an actual working memory module, are sometimes referred to herein and in the figures, as "devices under test" or "DUTs." The results of the PTs on these DUTs include respective ideal end of life (EOL) responses of dies 130. They are referred to herein as "ideal" because, being based on PTs at the wafer level during manufacture, prior to being cut into separate components and packaged, they represent the ideal behavior of each die. Once a die is cut from a wafer, packaged, and soldered into an actual SSD or DIMM, defects may be introduced. As a result, even prior to being placed in use, the die may no longer exhibit ideal behavior, and, as a result, its EOL response is very likely to be slightly different than that obtained as a result of its PT. After being trained on these ideal EOL responses, ANN 126 is able to recognize a unique operational signature of each die of dies 130, and is thereby able to uniquely identify one of dies 130 from all of the others, when an in-situ FT is run on it by EE 125. The results of the in-situ FT are stored in memory 127 temporarily, to perform a comparison between the PT and the FT, and output a deviation between them.

Continuing further with reference to FIG. 1, EE 125 is connected to processor 105, through output interface (OP I/F) 147, over link 145, through which it may send data or reports to an example application, user facing program 111, by which a user may view a deviation of an in-situ die from its ideal EOL response, as well as a useful life prediction and associated plots for the NVM die, such as, for example, a "health budget" and an EOL response curve from the time of the FT going forward. Example plots that may be output include those shown in FIGS. 5A and 5B. EE125 is also connected to dies 130, over link 131.

In embodiments, EE 125 may also send data or reports to the example application, user facing program 111, to inform a user that a NVM die, installed in memory module 100, is inauthentic, and does not have a signature matching any of the initial test results (probe test results) of any die designated, at manufacture, to be provided in SSD/DIMM 110. This report may be made to the user, for example, after a BOL FT is performed, as described below, such as, for example, in connection with FIG. 8.

In previous work, the inventors hereof described a technique for determining validity of a memory component used with a memory controller, to determine whether or not a NVM die of a memory was counterfeit. In that technique an ASIC or firmware of a MC of an NVM die included a validation component. The validation component included a hash function and a hash table, and, in embodiments, the validation component performed first test results using an FCT at manufacturing time, generated a first hash of the first test results using the hash function, and stored the first hash in the hash table. Subsequently, during usage of the NVM die, the validation component conducted an in-situ test to produce second test results, generated a second hash of the second test results using the hash function, and compared the first hash from the hash table with the second hash, and indicated an invalid memory when the first hash did not match the second hash.

In accordance with various embodiments, using an AI based algorithm, a much simpler approach is facilitated. Instead of hash tables, as in the prior approach, ANN 126 may be used to operate on the results of a BOL FT of a die, to determine whether or not the die is authentic. For example, an EE, performing a BOL FT on a given die, may recognize the "trim-by-die" parameters of the die, or for example, it may run a threshold voltage versus bias sweep to find a demarcation voltage $V_{DM}$ which is "adjoint" with the threshold voltage of the memory. Or, for example, it may test for failure distribution versus number of read/write cycles versus elapsed time of life span, such as, for example, in a RBER test. In embodiments, the actual test to be used by the EE may vary depending on which product or technology is being tested. The common link is to capture features of the die that are a function of each die's unique variability, and which cannot be replicated by a die that is manufactured on a different fabrication facility or process, which will not exhibit the same process variability as the original die that was paired with the memory module. Thus, this unique data can be used as the die's signature, and used to verify specific memory component pairing, to mitigate reverse engineering and counterfeiting.

In embodiments, a BOL FT and a later performed FT are physically the same tests. The only difference is that the BOL FT is performed at one time, where the EE takes a dummy address of the memory, provides a number of cycles to approximate a near EOL state, and collects RBER data. On the other hand, in embodiments, a standard FT involves collecting the RBER data while running the actual system. In embodiments, the ANN performs the same recognition for both tests, a BOL FT and a standard FT. In embodiments, the BOL is used for authentication, and the standard FT for diagnostics, as described below.

Figure 4A:
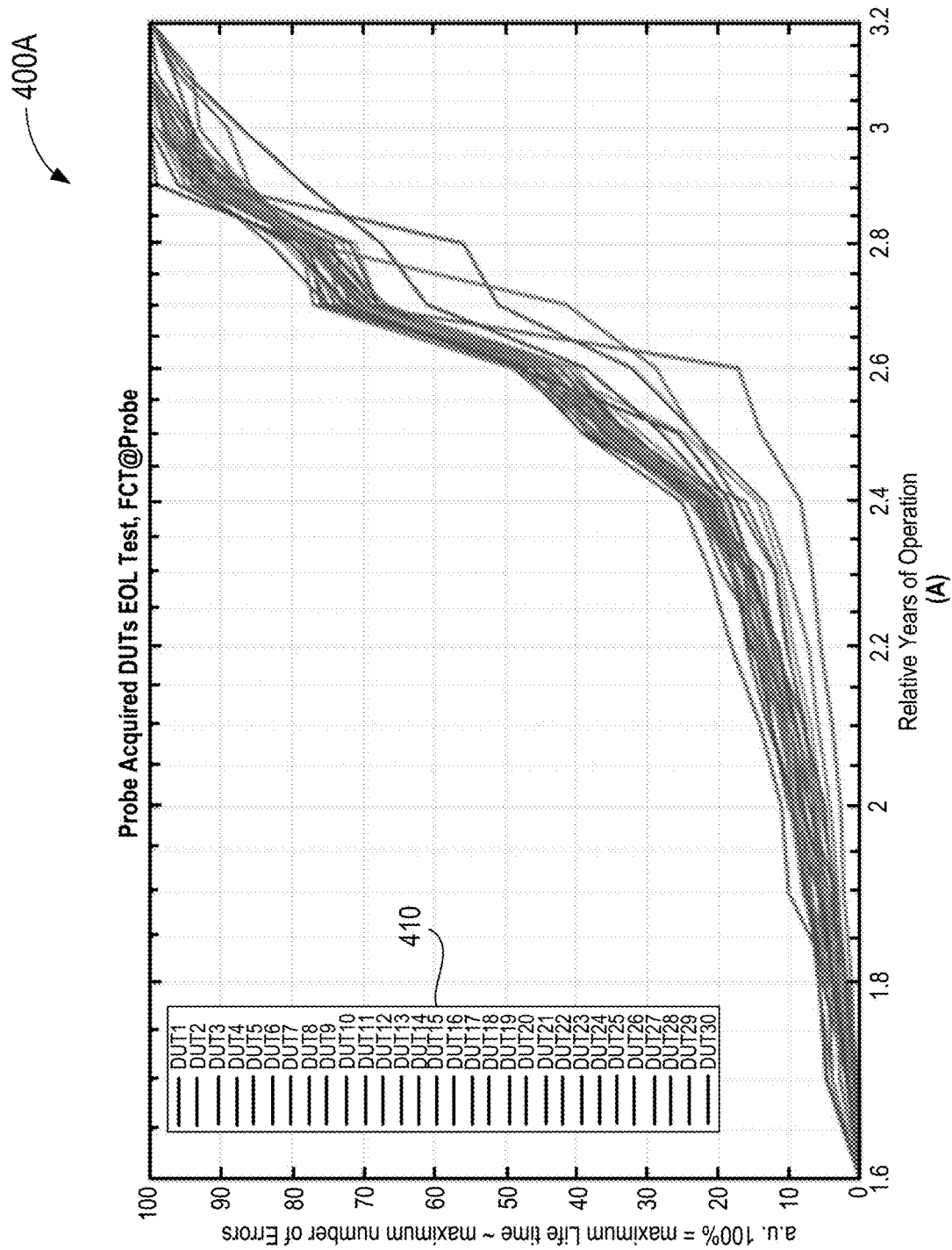
FIG. 4A illustrates an set of thirty EOL response curves respectively obtained from an example set of thirty dies, in accordance with various embodiments.
Figure 4B:
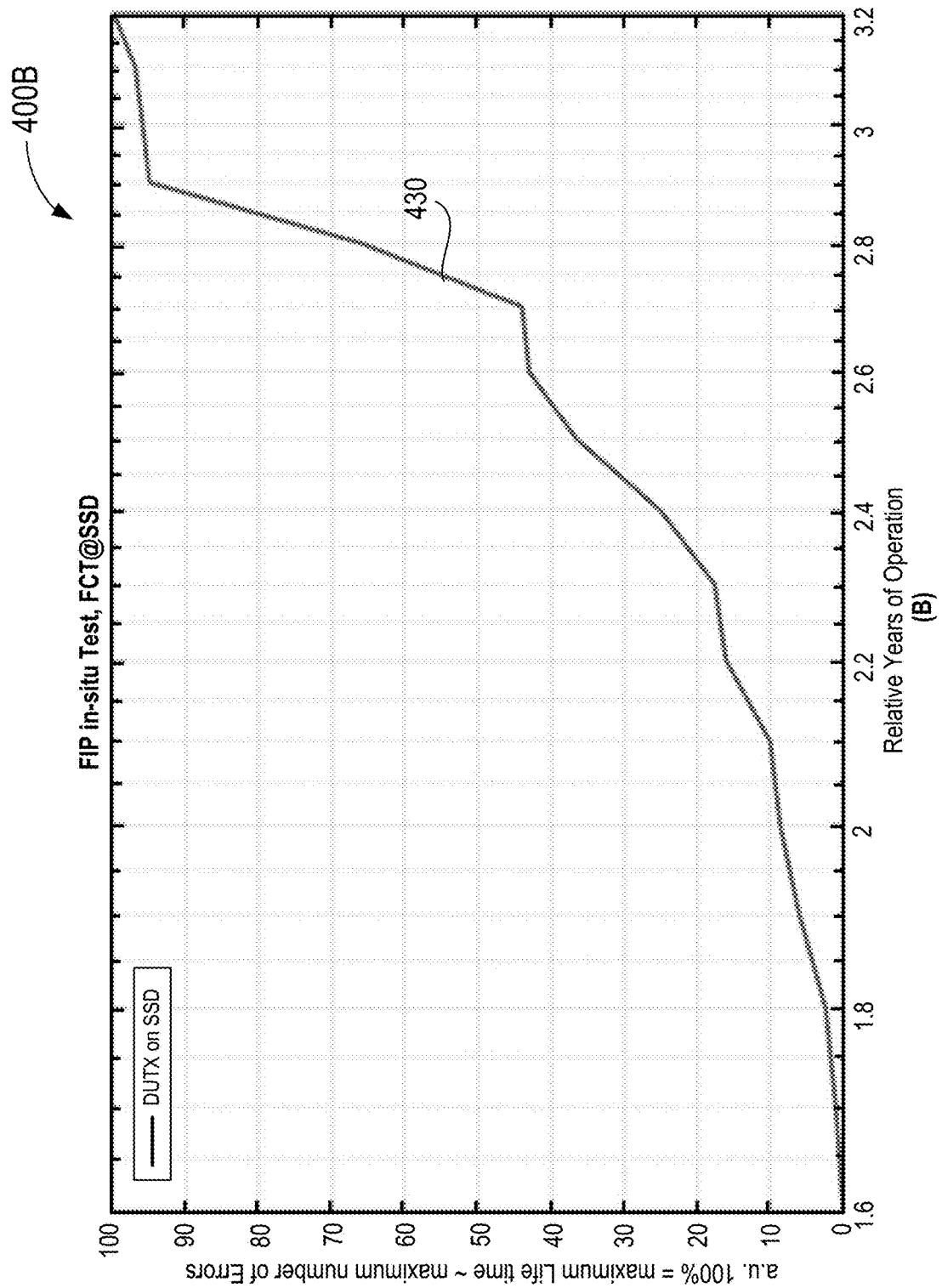
FIG. 4B illustrates an example EOL response curve from the set of curves of FIG. 4A, in accordance with various embodiments.

In embodiments, the EE may run a BOL FT a single time at power-on. For example, the FT may include a raw bit error rate (RBER) collection, which is a failure collection test (FCT) that mimics the lifespan of an NVM's expected workload and collects a number of failures at a predefined number of memory cycles within a predefined time unit. The results of this BOL FT include an EOL response such as shown in FIGS. 4A and 4B. The function of the BOL FT over the earlier PT being to collect more realistic data after packaging and other assembly issues which might impact the array performance. However, the BOL FT results and the PT results are close enough for the ANN, trained on the PT EOL results, to recognize the unique signature of the die, and identify the die by its original ideal EOL response. If no ideal EOL response is identified, the EE concludes that the die is counterfeit.

Figure 2A:
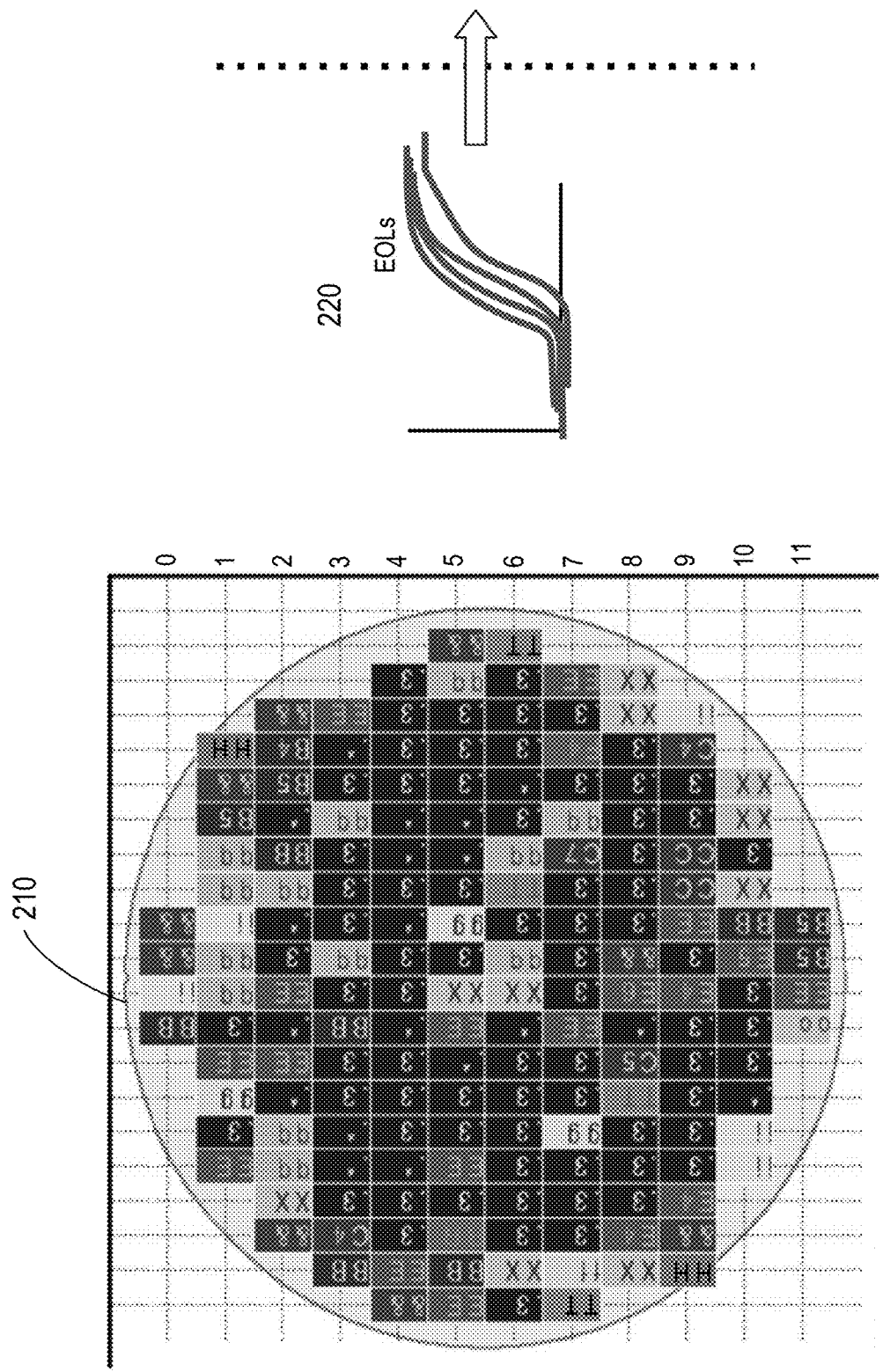
FIG. 2A illustrates an example wafer, including a set of NVM dies, and a corresponding set of end of life (EOL) responses for each of the dies, in accordance with various embodiments.

FIG. 2A illustrates an example wafer 210, including a set of NVM dies, and a corresponding set of ideal EOL responses 220 for each of the dies, in accordance with various embodiments. As noted above, EOL responses 220 are obtained during manufacturing, when the various dies are on wafer 210. As a result, no defects have yet been introduced, and responses 220 are thus ideal EOL responses.

Figure 2B:
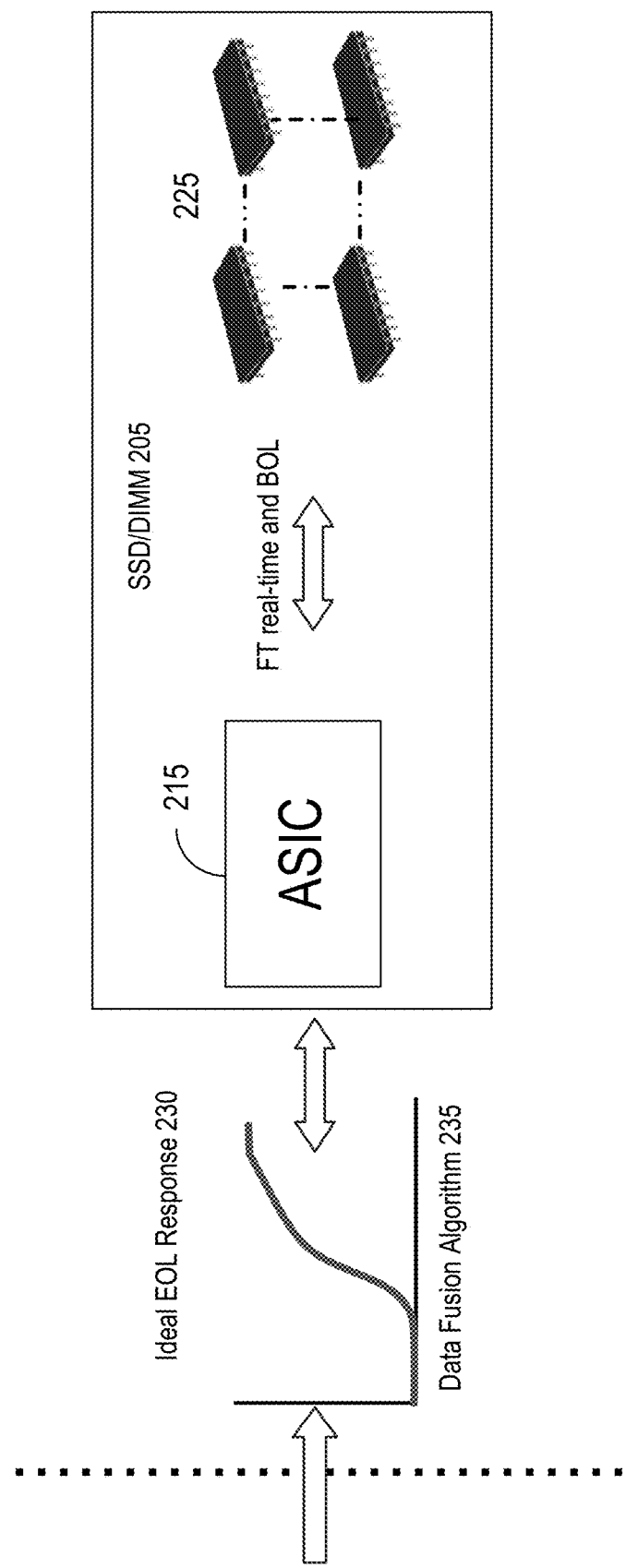
FIG. 2B illustrates extraction of an ideal EOL response using a data fusion algorithm operating on field tests of an example die, in accordance with various embodiments.

FIG. 2B illustrates extraction of an ideal EOL response 230 of an example single die using a DFA 235, for example as implemented in an ANN, operating on FT results of the die, in accordance with various embodiments. The die is one of multiple dies 225 on SSD/DIMM 205, coupled to a MC, in this example implemented in ASIC 215. Alternatively, the MC may be implemented in firmware (not shown). The FT, as shown, may be a real-time FT run during operation at various times that the die is in service, or it may be run at initial power-on of the SSD/DIMM, in which case it is referred to as a BOL FT, as described above. In embodiments, a FT run once a die has been placed into service, is performed while the MC is idle, and thus is not otherwise involved in managing memory accesses of the die. In embodiments, an FT and a BOL FT are performed when the MC is idle. However, in alternate embodiments, operation of the memory module may be interrupted, and a BOL FT or an FT executed.

Figure 3:
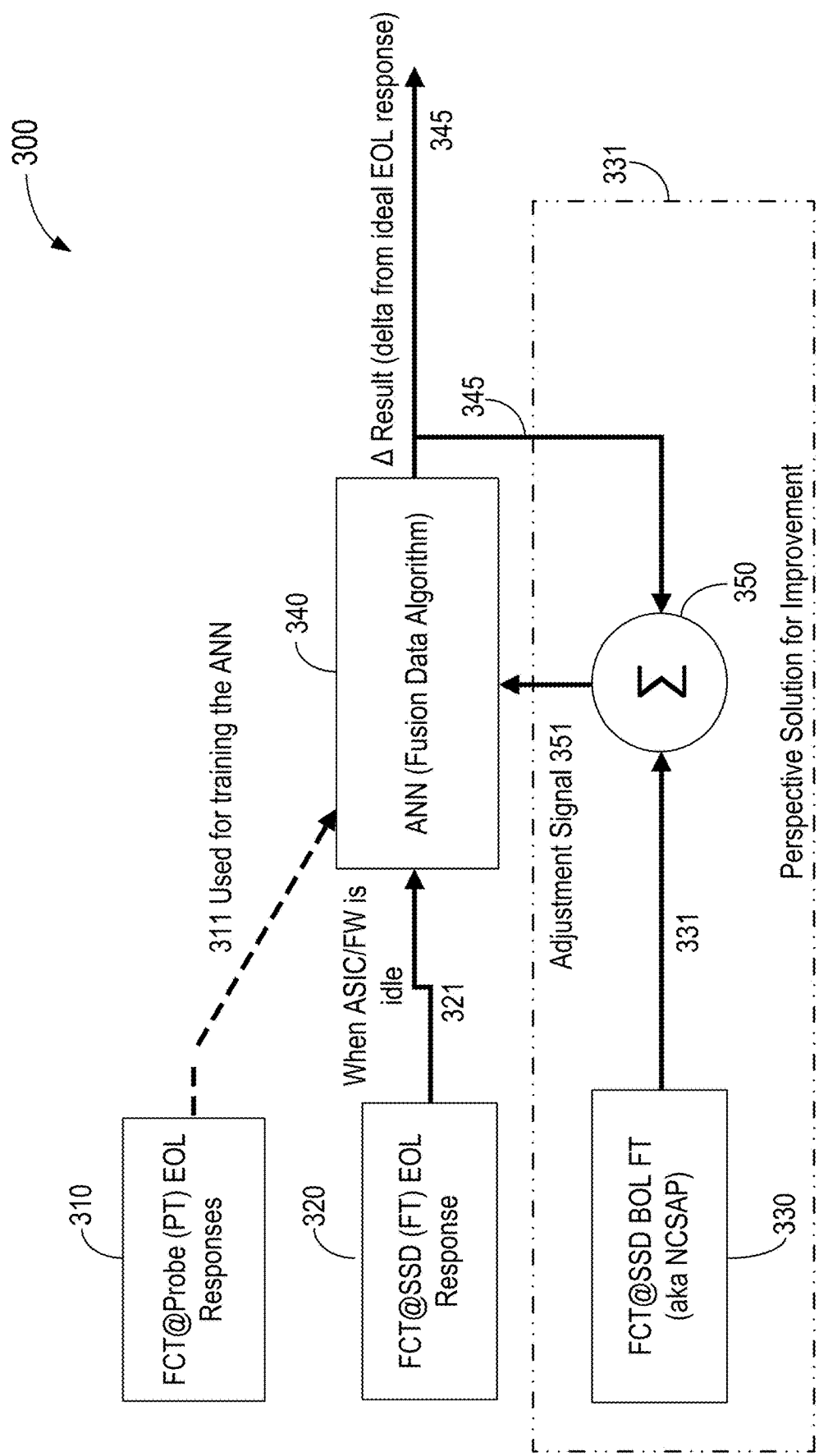
FIG. 3 illustrates training of an example ANN's fusion data algorithm and generating a delta-deviation result of an example fusion data algorithm implemented in an artificial neural network (ANN), in accordance with various embodiments.
Figure 5A:
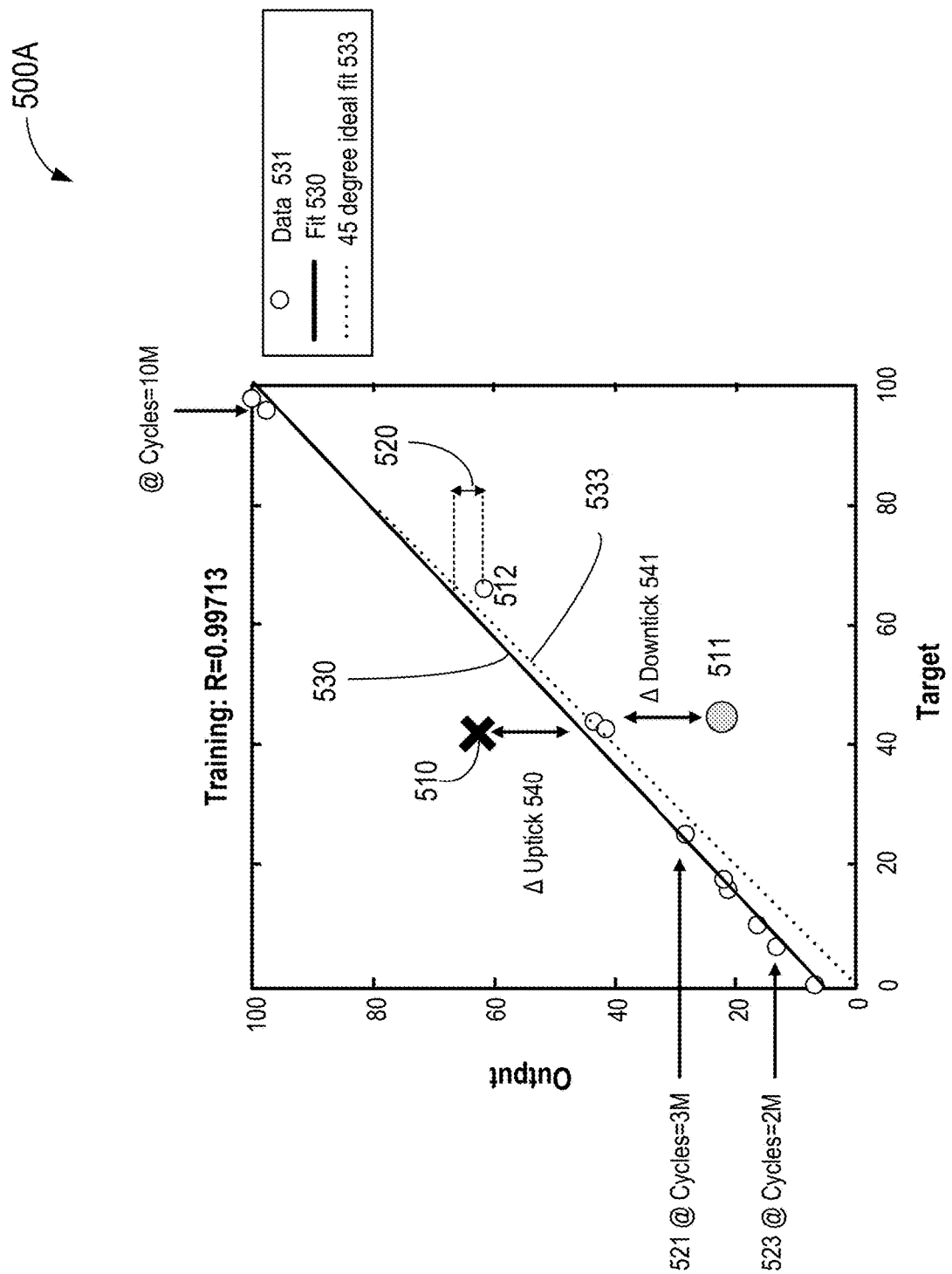
FIG. 5A is a plot of an ideal response compared with a best fit of actual EOL response data, showing example uptick and downtick deviations from the ideal EOL response, in accordance with various embodiments.

FIG. 3 illustrates an example process 300 for training of an example ANN and generating a delta-deviation result for a die in accordance with various embodiments. With reference to FIG. 3, ANN 340 implements a FDA, as described above. ANN 340 is trained by EOL responses 310, obtained from performing PTs on a set of dies at the time of manufacture, indicated in FIG. 3 by connecting line 311. Once trained, ANN 340 is implemented in a MC of a SSD/DIMM, for example in an ASIC or in firmware, and receives, via connection 321, an EOL response 320 from a FT performed on the in-situ die once the SSD/DIMM is operational. The EOL response resulting from FT 320 is an actual response, as described above. Given the actual EOL response, ANN 340 then identifies the corresponding ideal EOL response for that die, compares the two responses, and outputs a deviation result 345. In embodiments, the deviation result may be presented, for example, as shown in FIGS. 5A and/or 5B, as described in detail below.

Continuing with reference to FIG. 3, in some embodiments, a further tweak to ANN 340 may be performed. This is illustrated by dotted box 331. In these embodiments, ANN 340 is further adjusted by an initial FT performed once an example SSD/DIMM is placed into use by a consumer. Thus, the initial FT is performed at the beginning of a die's lifespan, when very few memory cycles have occurred. Because this FT is performed at the beginning of the life of the SSD/DIMM, it is termed a "beginning of life" or BOL FT 330. The EOL response of the BOL FT is sent to summing node 350, to be added, at summing node 350, to deviation result 345 to generate an adjustment signal 351, which is used by ANN 340 to adjust the ideal EOL response baseline it uses for calculating deviation results. The adjustment of adjustment signal 351 takes into account performance changes of the dies resulting from packaging of the dies in the SSD/DIMM, as well as may be due to temperature and mechanical operational conditions of the SSD/DIMM that cause a slight change from a die's ideal EOL response obtained from the PT results, including, for example, assembly induced stress.

As noted above, the FDA is able to recognize a die's unique behavior, gathered by a PT, and compare it to real-life in-situ behavior, in order to estimate the deviation result. Using the deviation result, the EE may further report a remaining health budget for a die, as well as an EOL response going forward. In embodiments, the deviation result is used to monitor and report to a user any uptick or downtick in system real-life usage. In embodiments, an uptick or downtick may be reported any time a FT of a die is performed, or, for example, only if the deviation result exceeds a predetermined threshold. The core of the FDA being the ANN, various embodiments thus implement fuzzy logic, where a failure rate for an actual time and number of cycles may not correspond with the time and cycle count obtained from the PTs. In many other implementations this would require leaner regression and thus loss of information, however, in embodiments, the fuzzy logic handles these operations with nearly no loss of information.

FIG. 4A illustrates a plot 400A of thirty exemplary EOL responses obtained by respectively performing PTs on thirty DUTs at the time of manufacture, when they are, for example, in the state shown in FIG. 2A. These are labeled DUT1 through DUT30 410. Ideal EOL responses 410 were used by the inventors to train a Feed-Forward 3-Layer Perceptron Artificial Neural Network using the Levenberg-Marquardt training algorithm for a function fitting network. After training, a plot 400B of an actual EOL response, as shown in FIG. 4B, obtained in an in-situ FT performed on one of the thirty dies of FIG. 4A was fed into the ANN for recognition. The trained ANN was able to recognize an ideal EOL response (FCT@Probe) for the die with a confidence level of approximately 99%, even taking into account that the trend was slightly modified, to mimic the actual impact of the environment on real system usage, such as, for example, due to temperature and/or vibration.

FIG. 5A illustrates a plot 500A of an example deviation result, and related information, obtained in accordance with various embodiments. With reference to FIG. 5A, the independent variable, labeled "Target" corresponds to a lifespan of a die, which may be some combination of accumulated read/write cycles and actual elapsed time to simulate actual years of operation. The dependent variable, labeled "Output" in FIG. 5A represents a percentage of failures corresponding to the value of "Target." Thus, at the BOL a die has a very low failure rate, and at the EOL the failure rate is a 100%. In general, the results of an actual real time FT indicate an acceleration of the ideal wear out progression. This acceleration corresponds to a translation upwards, in the two-dimensional (2D) space of FIG. 5A, as shown.

Continuing with reference to FIG. 5A, there is shown ideal fit line 533, which represents PT acquired data (FCT@Probe), and which serves as the reference data for delta calculation by an ANN. The real-time in-situ deviation result may thus, for example, be illustrated with reference to ideal fit line 533. Also shown in FIG. 5A are data points 531, taken, for example, at a simulated 2M cycles 523, 3M cycles 521, and various other points. To illustrate an overall EOL response for the die, the various data points 531 are connected with a best fit line 530.

Continuing further with reference to FIG. 5A, distance 520 illustrates the actual health of the memory die at a real-time operational point 512, at a corresponding cycle count. Calculated as the delta between PT data reference line 533, and the same FCT test (FCT@System) collected and executed by an EE of a SSD/DIMM system during a real-time FT.

There are further shown two example abnormal data points, 510 and 511, that illustrate significant deviations from ideal behavior. These example data points are not part of the same data indicated by smaller circles 531, but placed on the same plot for illustration purposes. Point 511 shows the case of a significant improvement over the PT data ideal EOL response. Thus, relative to the PT data, point 511 has a significantly lower failure rate than expected, the delta between them being expressed as downtick 541. On the other hand, data point 510 illustrates the case where real-time in-situ behavior is worse than the ideal, by a delta expressed as uptick 511. A significant uptick may capture a die that is over cycled, prematurely wearing out, and thus its reliability significantly reduced. Data point 510 exhibits a higher failure rate relative to its probe level behavior, and also relative to other dies used in the same system. In this context it is noted that there are various reasons that can impact the wear-out cycle of a die, and when that happens, firmware handling functions that control the wear-out leveling can be tweaked by an outlier die detection algorithm. In embodiments, the firmware runs on a MC implemented as an ASIC, for example. As an example of such tweaking, in embodiments, for an Intel Optane™ SSD, timing constrains of refresh may be tuned so as to bring an outlier die back within normal operation. In theory, the wear out trends evidenced in PT data and in FT data should be identical, but in reality, as shown in FIG. 5A, they are generally slightly offset.

In embodiments, end-product cost may be reduced by using components with higher inter or intra die variability and/or picking such components from lower tiers. This is because an on chip diagnostic functionality in accordance with various embodiments allows outlier dies to be easily identified prior to failure, and it is no longer necessary to rely on an assumed average life of a memory die, and require smaller variability of dies so that an example SDD or DIMM may be assumed to have most of its dies wear out at the same time, and initiate a rebuild prior to that time.

In embodiments, an ANN based FDA provides an advantage over linear regression, which may oversimplify real-life events, such as, for example, upticks and downticks. Moreover, some EOL responses may contain non-linear dependencies which must be processed with high-accuracy. Thus, in embodiments, multiple functions are provided. These include recognition of die health data acquired in real-time from an operating system, prediction of a die's remaining health budget, detection of die inauthenticity to enhance security, and premature or erratic wear-out indication. As noted above, in embodiments, besides providing an improvement to overall QoS, the overall cost of end-products may also be reduced.

Figure 5B:
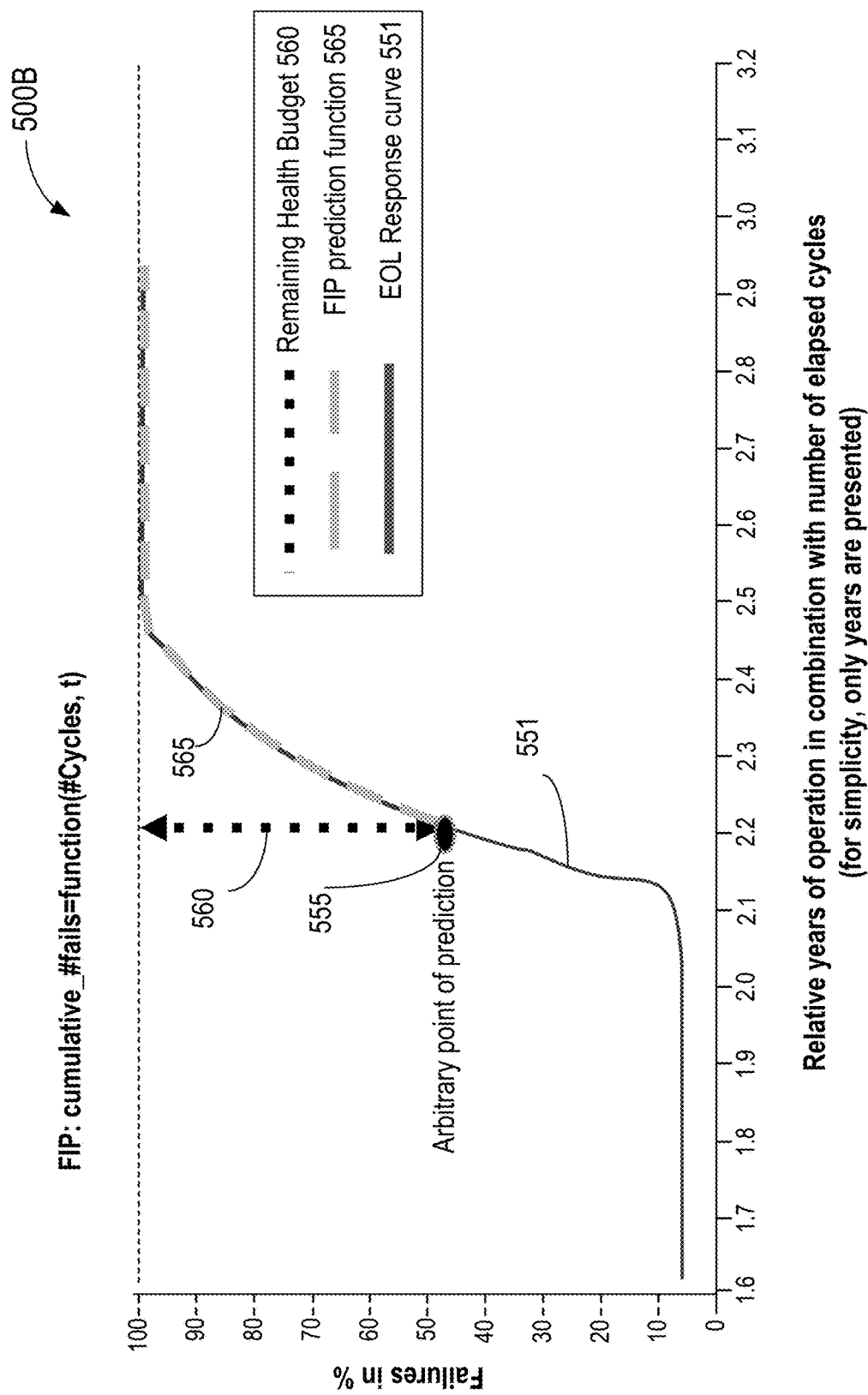
FIG. 5B illustrates a remaining budget and an actual health budget for an example NVM die, in accordance with various embodiments.

FIG. 5B depicts an example output 500B to user following a FT, for a given die. As noted above in connection with FIG. 1, plot 500B of FIG. 5B may be presented to a user via user facing program 111. In some embodiments, the plots of FIG. 5B may be presented to a user only when there is a significant deviation result obtained, based on a pre-defined threshold. In other embodiments, the information may be presented after every FT of a die, such as, for example, via a NVMe log file. In embodiments, a FT may be performed at pre-defined equal intervals of elapsed time and memory cycles performed.

With reference to FIG. 5B, there is depicted a plot of predicted future percentage bit failures versus relative years of operation, for an example NVM die, superimposed upon an actual EOL response curve for the NVM die, in accordance with various embodiments. The information presented in FIG. 5B is forward looking, from arbitrary point of prediction 555, which is the point on the die's EOL response at which the most recent FT was performed. Thus, life remaining health budget arrow 560 of FIG. 5B provides a remaining budget for the die in terms of a total remaining number of cycles, or a total remaining life percentage, that the die can be expected to support. In addition, failure indicator prediction (FIP) curve 565 generates an actual future prediction of failure percentage going forward, as a function of both number of cycles and time, for the die. Thus, curve 565 presents an expected EOL response of the die based on current FT based data, which includes how the coming degradation will vary in time (e.g., the slope of curve 565 at each data point).

Figure 6:
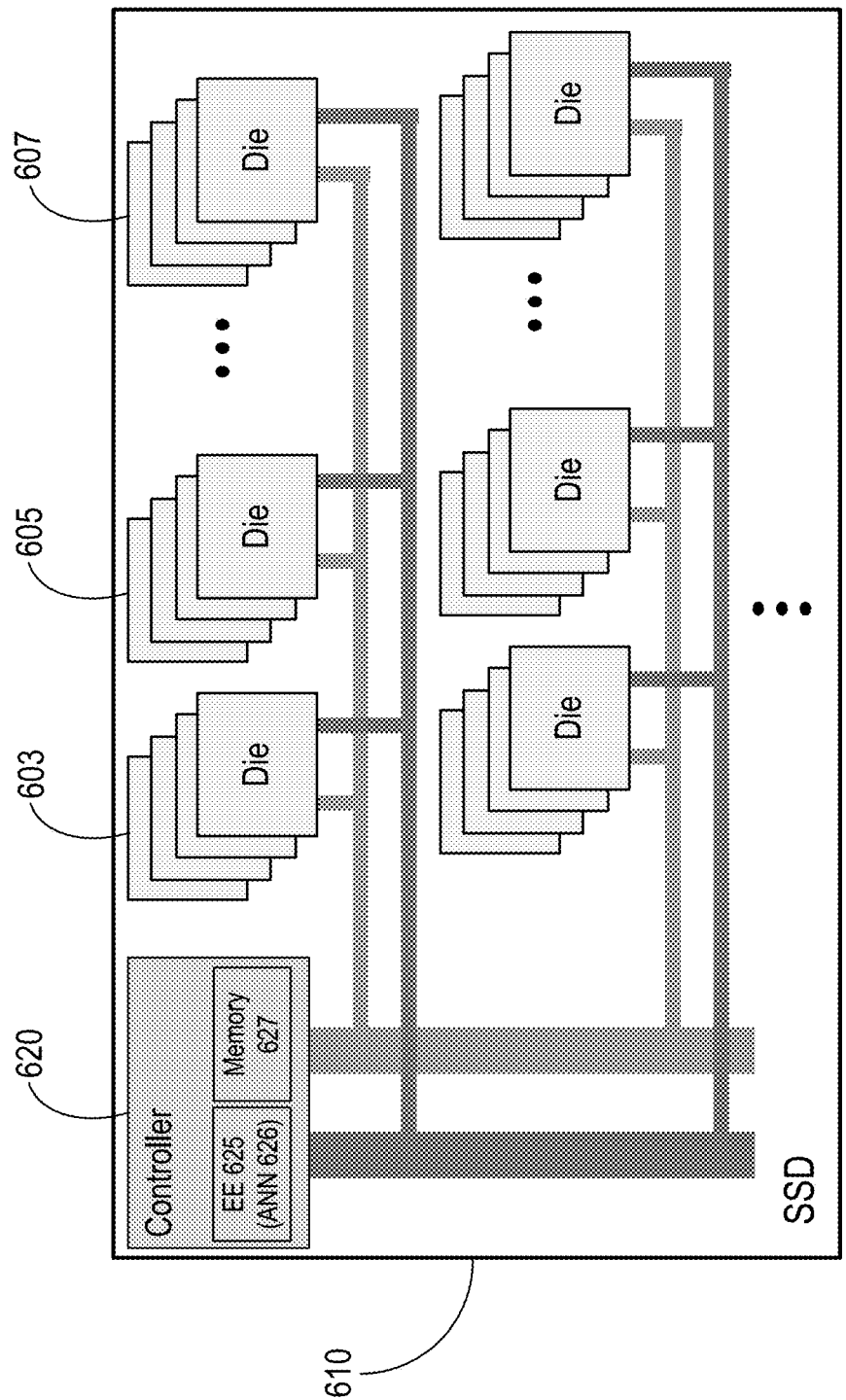
FIG. 6 illustrates an example SSD including a plurality of NVM dies and a memory controller including an execution engine (EE), in accordance with various embodiments.

FIG. 6 illustrates an example SSD 610 including a plurality of NVM dies, for example, those comprising rows 603, 605, 607, etc., and an ASIC controller 620, in accordance with various SSD based embodiments. With reference thereto, SSD 610 may include ASIC controller 620, which may include EE 625 and memory 627. As noted above, in embodiments, EE 625 may perform a FT on one of the dies of the SSD and acquire an actual EOL response for that die at that point in time. Based on the actual EOL response, the EE recognizes the signature of the die, associates a corresponding ideal EOL response, and calculates a deviation of the actual EOL response from the ideal EOL response, as shown, for example in FIG. 5A. In embodiments, the deviation may be an uptick or a downtick, and may or may not be significant enough to alert a user. Thus, based on actual EOL responses, and associated deviations from identified ideal EOL responses, EE 625 may, in embodiments, perform failure prediction for each of the plurality of NVM dies included within SSD 610. In some embodiments, EE 625 may also automatically remove a NVM die from service when a certain point of its actual EOL response is passed, and offload the die's contents to other memory cells. In such embodiments, this feature prevents failure if a user does not, for some reason, attend to a failure warning. For example, if an over cycled die, as discussed above in connection with FIG. 5A, does not respond to tweaks to operational parameters, EE 625 may isolate the failing die and alert a user that it is offline, and needs maintenance or a full rebuild. In such case the die would remain offline until the required maintenance has been performed, or it has been rebuilt.

Figure 7:
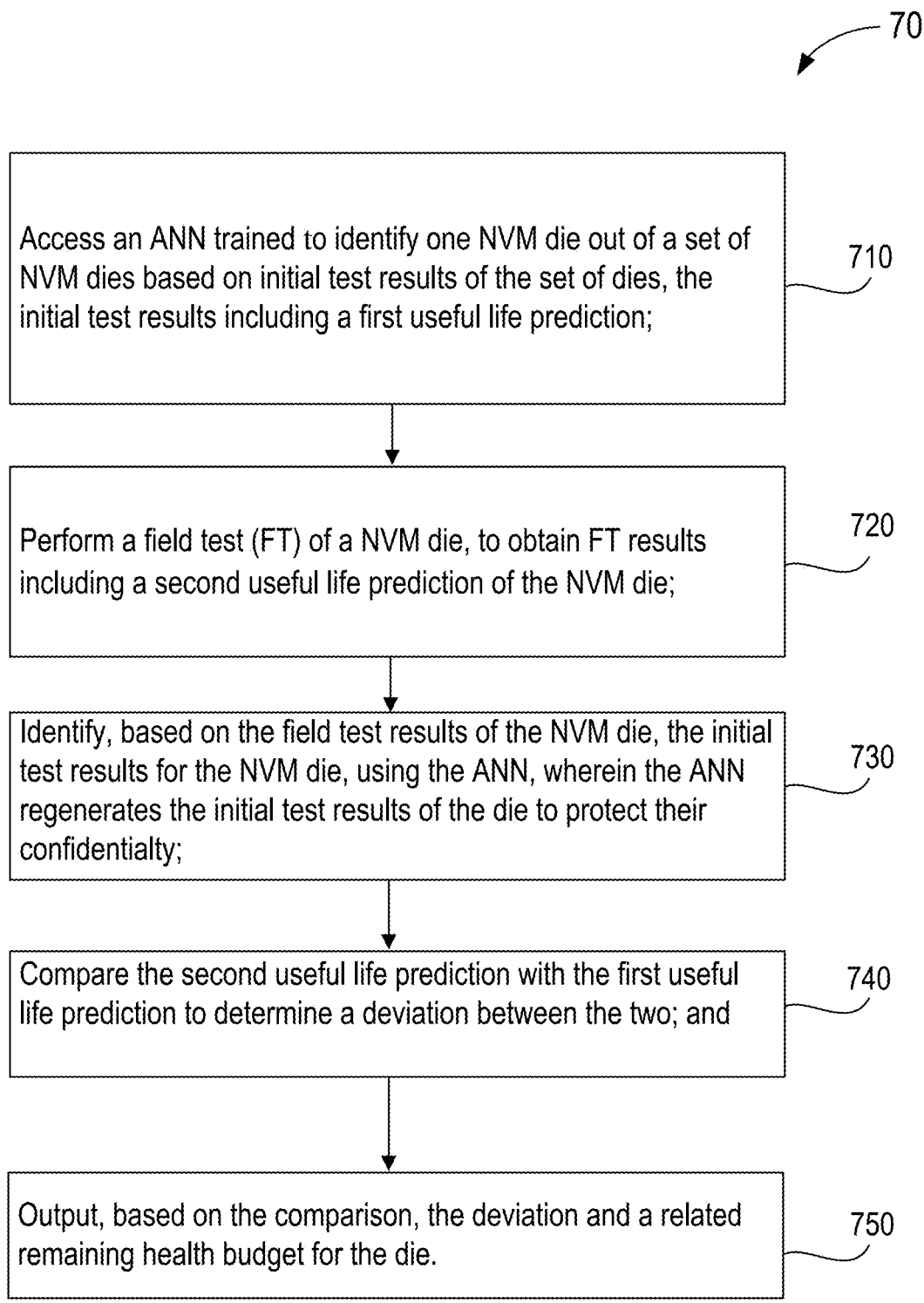
FIG. 7 illustrates an overview of the operational flow of a process for identifying an ideal EOL response for a die using an ANN, comparing the ideal response to an actual response, and outputting a deviation from the ideal EOL response, in accordance with various embodiments.

Referring now to FIG. 7, an overview of the operational flow of a process for identifying, based on field test results of a die, initial test results (an ideal EOL response) of the die using an ANN, the initial test results including a first useful life prediction for the die, the field test results including a second useful life prediction, comparing the second useful life prediction with the first useful life prediction, and outputting a deviation between the two, in accordance with various embodiments, is presented. Process 700 may be performed, for example, by an apparatus such as controller 120, shown in FIG. 1, or controller 620 shown in FIG. 6. Process 700 includes blocks 710 through 750. In alternate embodiments, process 700 may have more or less operations, and some of the operations may be performed in different order.

Process 700 begins at block 710, where a controller accesses an ANN trained to identify one NVM die out of a set of NVM dies based on initial test results of the set of dies (such as, for example, the 30 EOL responses shown in FIG. 4A), the initial test results including a first useful life prediction for each die in the set. For example, the ANN may be implemented in an EE of the controller, such as, for example, EE 125 of FIG. 1, or EE 625 of FIG. 6.

From block 710, process 700 proceeds to block 720, where the controller performs one or more FTs, to obtain FT results, including a second useful life prediction of the NVM die. In embodiments, the initial tests and the FTs may associate failure rates with one or more read/write cycles of a NVM die. For example, the initial tests and the field tests may include a RBER test, or, in the case of a FT performed by accumulating data for a given die over time and cycles, the filed test results may include accumulated RBER data. The die subjected to the FT may be, for example, one of dies 130 of FIG. 1, or dies in rows 603, 605 and 607, of FIG. 6.

From block 720, process 700 proceeds to block 730, where the controller identifies, based on the FT results of the NVM die, the initial test results for that die, using the ANN. For example, the FT results may be equivalent to the EOL response shown in FIG. 4B, which is an actual EOL response obtained from results of an in-situ FT, as described above. The ANN recognizes the unique signature of the die, which is embodied in the EOL response obtained in the field test, and matches it to one of the initial field test results on which the ANN was originally trained. As noted above, the ANN regenerates the initial test results based on its training, and as a result, none of the initial test results are stored in the MC, which fully protects this confidential data.

From block 730, process 700 proceeds to block 740, where the controller compares the second useful life prediction with the first useful life prediction to determine a deviation between the two. As noted above, this deviation may be an uptick or a downtick, as described with reference to FIG. 5A.

Finally, from block 740, process 700 proceeds to block 750, where the controller outputs, based on the comparison, both the deviation between the second useful life prediction and the first useful life prediction, and a related remaining health budget for the die. For example, the controller may cause a user facing program on a coupled processor, such as user facing program 111 of FIG. 1, running on processor 105, to display to the user a plot similar to that shown in FIG. 5A, illustrating the deviation, and also a plot similar to that shown in FIG. 5B, illustrating the remaining useful life, or health budget of the NVM die, or, instead, simply output to the user the value indicated by remaining health budget arrow 560 of FIG. 5B. In embodiments, by reviewing the deviation and related information, the user may plan for rebuild and/or replacement of the die.

Figure 8:
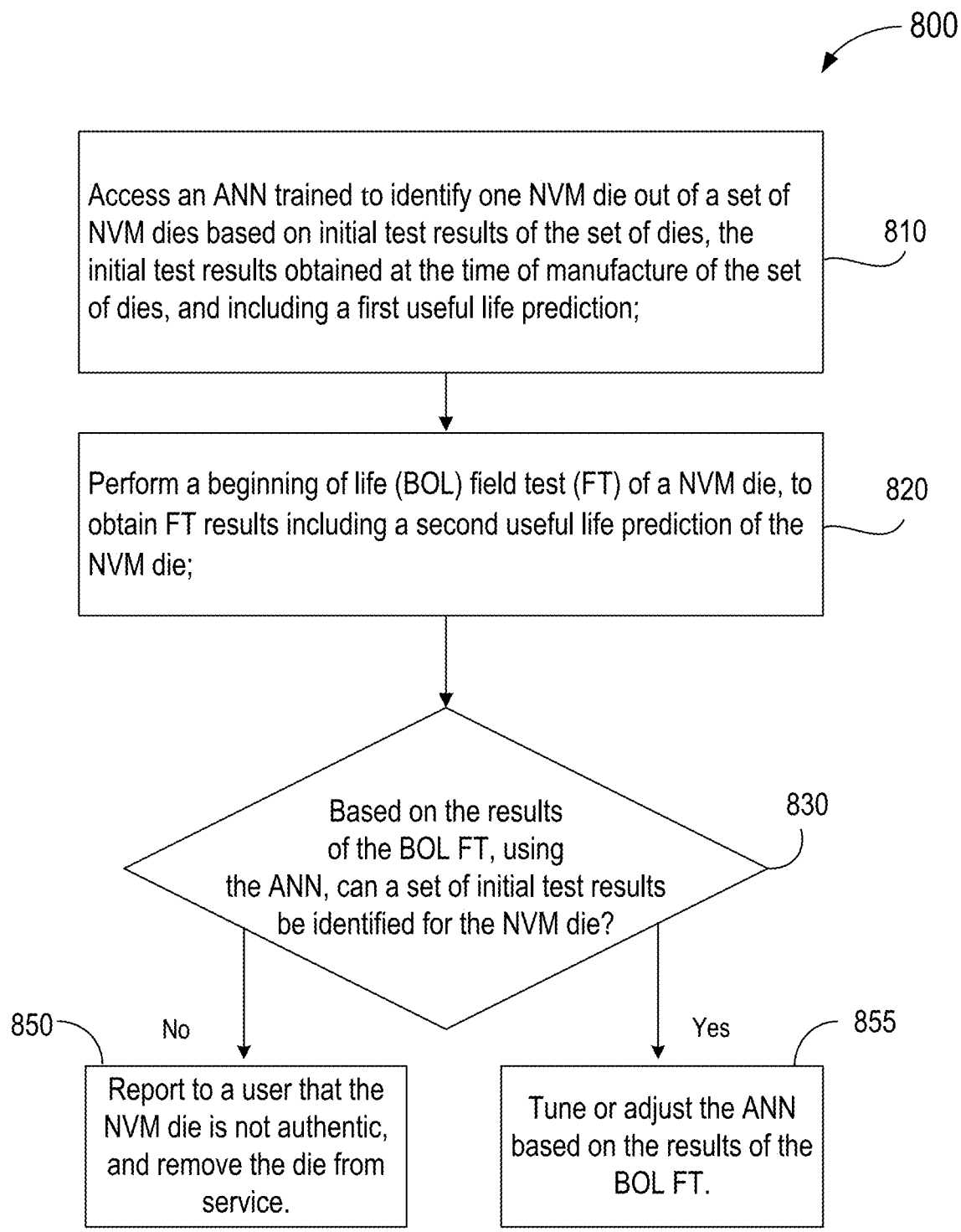
FIG. 8 illustrates an overview of the operational flow of a process for performing a beginning of life (BOL) field test on an example die provided in a SSD when first put into use and determining whether the die is authentic, in accordance with various embodiments.

Referring now to FIG. 8, an overview of the operational flow of a process 800 for performing a BOL FT on an example NVM die provided in a memory module, such as, for example, a SSD or a DIMM, and determining whether the die is authentic, is presented in accordance with various embodiments. Process 800 may be performed by an apparatus such as, for example, controller 120, shown in FIG. 1, or controller 620 shown in FIG. 6, each accessing an ANN trained to recognize individual dies out of a set of dies that have been installed in a memory module or device, such as a SSD or a DIMM. Process 800 includes blocks 810 through 855. In alternate embodiments, process 800 may have more or less operations, and some of the operations may be performed in different order.

Process 800 begins at block 810, where the controller accesses an ANN trained to identify one NVM die out of a set of NVM dies based on initial test results of the set of dies (such as, for example, the 30 EOL responses shown in FIG. 4A), the initial test results including a first useful life prediction for each die in the set. For example, the initial test results may be the results of a RBER test performed on each die intended to be provided in a DIMM, and these tests may be performed at the time of manufacture of the set of dies.

From block 810, process 800 proceeds to block 820, where the controller performs a BOL FT of a NVM die, to obtain FT results including a second useful life prediction of the NVM die. The die being tested in block 820 is one of the dies in a memory module, and at this point in time, it is assumed to be one of the original dies tested at manufacture.

From block 820, process 800 proceeds to query block 830, where the controller, based on the results of the BOL FT, using the ANN, determines whether initial test results may be identified for the NVM die. This is to test whether the FT results indicate, via a unique signature of the die, perceived by the ANN, that the die is authentic, and thus has corresponding initial test results from its probe test. If query block 830 returns a "No", and thus the controller cannot match the FT results to any of the initial test results it was trained on, then process 800 moves to block 850 where the controller reports to the user that the coupled NVM die is not authentic, and removes the die from service. For example, the controller sends a signal to a coupled processor, such as processor 105 of FIG. 1, which is running user facing program 111. Upon receiving the signal from, for example, controller 120, user facing program 111 displays a message to a user advising of the security breach, and that is has been resolved.

On the other hand, if, at query block 830 a "Yes" is returned, then process 800 moves to block 855, where, given that the die under test is in fact authentic, the controller tunes or adjusts the ANN based on the results of the BOL FT. Here the BOL FT provides useful information as to the change in test results, and thus, a corresponding change in predicted useful life of the die, between the end of manufacturing process and the beginning of actual use of the die. This delta-deviation between initial test results and BOL FT results for the die may be used, for example, as shown in FIG. 3, where BOL FT 330 is used to generate adjustment signal 351 to fine tune ANN 340.

Figure 9:
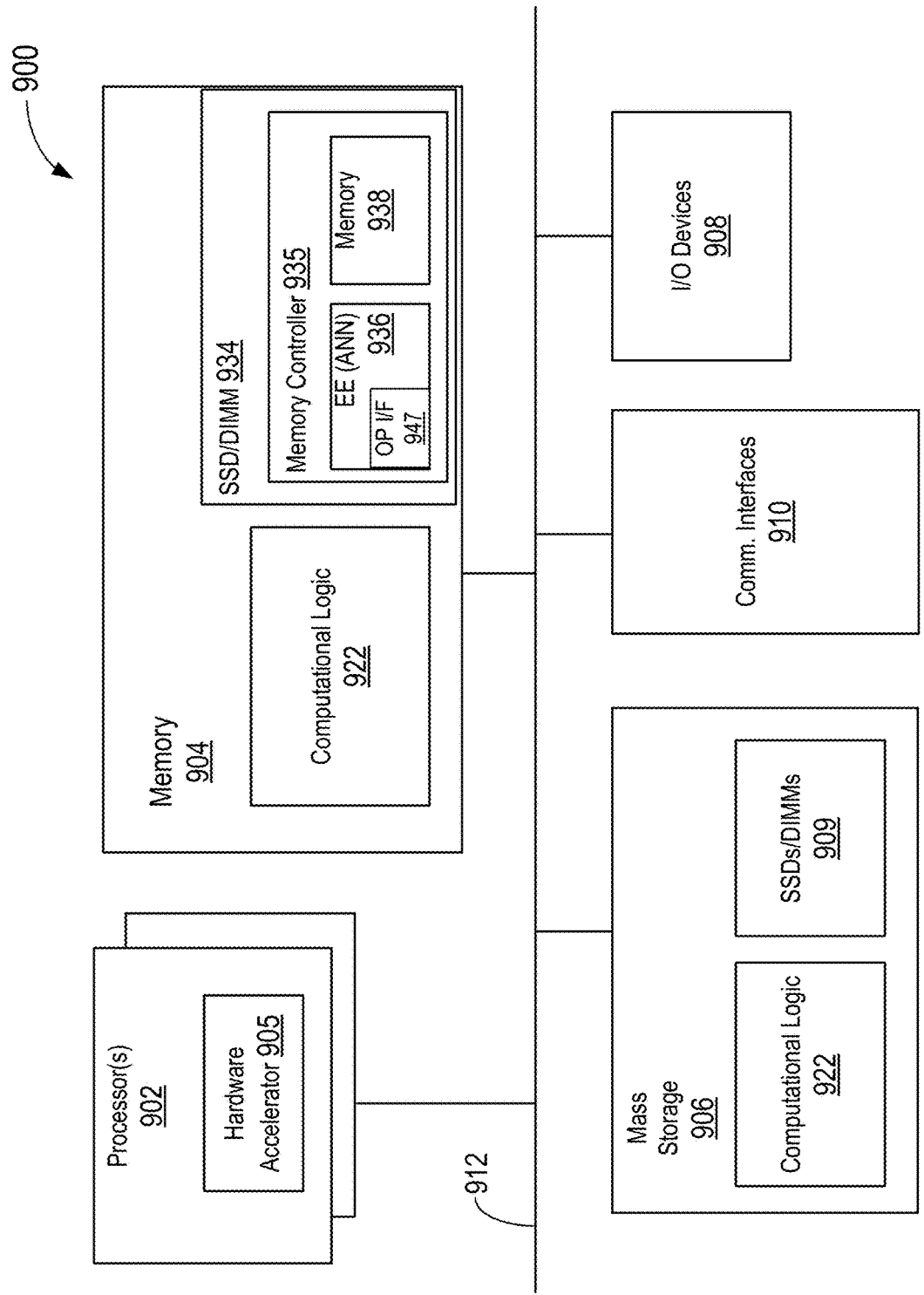
FIG. 9 illustrates a block diagram of a computer device suitable for practicing the present disclosure, in accordance with various embodiments.

Referring now to FIG. 9 wherein a block diagram of a computer device suitable for practicing the present disclosure, in accordance with various embodiments, is illustrated. As shown, computer device 900 may include one or more processors 902, and system memory 904. Each processor 902 may include one or more processor cores, and hardware accelerator 905. An example of hardware accelerator 905 may include, but is not limited to, programmed field programmable gate arrays (FPGA). In embodiments, processor 902 may also include a memory controller (not shown). In embodiments, system memory 904 may include any known volatile or non-volatile memory, including, for example, SSD/DIMM 934. SSD/DIMM 934 may include memory controller 935, which itself may include EE 936, output interface 947, and memory 938. In embodiments, EE 936 is provided with an ANN, as indicated, to recognize one NVM die from the set of NVM dies included in SSD/DIMM 934, as described above. Memory controller 935 may perform AI based security and diagnostic functions for SSD/DIMM 934, as described in detail above.

Additionally, computer device 900 may include mass storage device(s) 906 (such as SSDs or DIMMs 909), input/output device interface 908 (to interface with various input/output devices, such as, mouse, cursor control, display device (including touch sensitive screen), and so forth) and communication interfaces 910 (such as network interface cards, modems and so forth). In embodiments, communication interfaces 910 may support wired or wireless communication, including near field communication. The elements may be coupled to each other via system bus 912, which may represent one or more buses. In the case of multiple buses, they may be bridged by one or more bus bridges (not shown). It is here noted that although not shown, when mass storage 906 includes SSDs/DIMMs, such SSDs/DIMMs may also include an integrated controller, such as controller 935, to perform AI based security and diagnostic functions for SSDs/DIMMs 909.

In embodiments, system memory 904 and mass storage device(s) 906 may be employed to store a working copy and a permanent copy of the executable code of the programming instructions of an operating system, one or more applications, and/or various software implemented components of processor 105 and controller 120 (including EE 125 and ANN 126), both of FIG. 1, or of controller 620 (including EE 625 and ANN 626) of FIG. 6, collectively referred to as computational logic 922. The programming instructions implementing computational logic 922 may comprise assembler instructions supported by processor(s) 902 or high-level languages, such as, for example, C, that can be compiled into such instructions. In embodiments, some of computing logic may be implemented in hardware accelerator 905. In embodiments, part of computational logic 922, e.g., a portion of the computational logic 922 associated with the runtime environment of the compiler may be implemented in hardware accelerator 905.

The permanent copy of the executable code of the programming instructions or the bit streams for configuring hardware accelerator 905 may be placed into permanent mass storage device(s) 906 and/or hardware accelerator 905 in the factory, or in the field, through, for example, a distribution medium (not shown), such as a compact disc (CD), or through communication interfaces 910 (from a distribution server (not shown)). While for ease of understanding, the compiler and the hardware accelerator that executes the generated code that incorporate the predicate computation teaching of the present disclosure to increase the pipelining and/or parallel execution of nested loops are shown as being located on the same computing device, in alternate embodiments, the compiler and the hardware accelerator may be located on different computing devices.

The number, capability and/or capacity of these elements 905-938 may vary, depending on the intended use of example computer device 900, e.g., whether example computer device 900 is a smartphone, tablet, ultrabook, a laptop, a server, a set-top box, a game console, a camera, and so forth.

Figure 10:
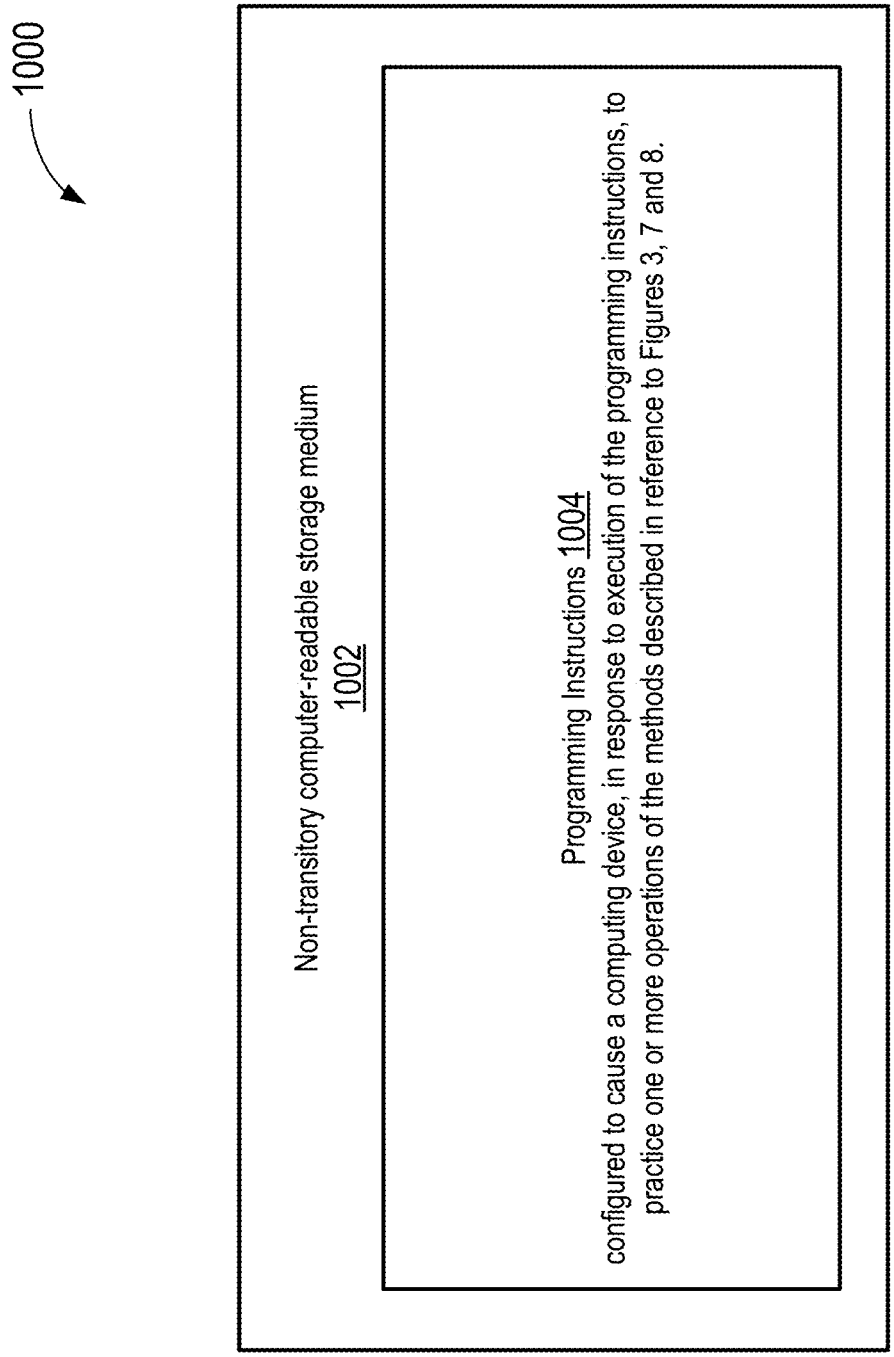
FIG. 10 illustrates an example computer-readable storage medium having instructions configured to practice aspects of the processes of FIGS. 7 and 8, in accordance with various embodiments.

Furthermore, the present disclosure may take the form of a computer program product or data to create the computer program, with the computer program or data embodied in any tangible or non-transitory medium of expression having the computer-usable program code (or data to create the computer program) embodied in the medium. FIG. 10 illustrates an example computer-readable non-transitory storage medium that may be suitable for use to store instructions (or data that creates the instructions) that cause an apparatus, in response to execution of the instructions by the apparatus, to practice selected aspects of the present disclosure. As shown, non-transitory computer-readable storage medium 1002 may include a number of programming instructions 1004 (or data to create the programming instructions). Programming instructions 1004 may be configured to enable a device, e.g., device 900, or components thereof, in response to execution of the programming instructions, to perform, e.g., various programming operations associated with operating system functions, one or more applications, and/or aspects of the present disclosure.

In alternate embodiments, programming instructions 1004 (or data to create the instructions) may be disposed on multiple computer-readable non-transitory storage media 1002 instead. In alternate embodiments, programming instructions 1004 (or data to create the instructions) may be disposed on computer-readable transitory storage media 1002, such as, signals. Any combination of one or more computer usable or computer readable medium(s) may be utilized. The computer-usable or computer-readable medium may be, for example but not limited to, one or more electronic, magnetic, optical, electromagnetic, infrared, or semiconductor systems, apparatuses, devices, or propagation media. More specific examples (a non-exhaustive list) of a computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program (or data to create the program) is printed, as the program (or data to create the program) can be electronically captured, via, for instance, optical scanning of the paper or other medium, then compiled, interpreted, or otherwise processed in a suitable manner, if necessary, and then stored in a computer memory (with or without having been staged in or more intermediate storage media). In the context of this document, a computer-usable or computer-readable medium may be any medium that can contain, store, communicate, propagate, or transport the program (or data to create the program) for use by or in connection with the instruction execution system, apparatus, or device. The computer-usable medium may include a propagated data signal with the computer-usable program code (or data to create the program code) embodied therewith, either in baseband or as part of a carrier wave. The computer usable program code (or data to create the program) may be transmitted using any appropriate medium, including but not limited to wireless, wireline, optical fiber cable, RF, etc.

In various embodiments, the program code (or data to create the program code) described herein may be stored in one or more of a compressed format, an encrypted format, a fragmented format, a packaged format, etc. Program code (or data to create the program code) as described herein may require one or more of installation, modification, adaptation, updating, combining, supplementing, configuring, decryption, decompression, unpacking, distribution, reassignment, etc. in order to make them directly readable and/or executable by a computing device and/or other machine. For example, the program code (or data to create the program code) may be stored in multiple parts, which are individually compressed, encrypted, and stored on separate computing devices, wherein the parts when decrypted, decompressed, and combined form a set of executable instructions that implement the program code (the data to create the program code (such as that described herein. In another example, the Program code (or data to create the program code) may be stored in a state in which they may be read by a computer, but require addition of a library (e.g., a dynamic link library), a software development kit (SDK), an application programming interface (API), etc. in order to execute the instructions on a particular computing device or other device. In another example, the Program code (or data to create the program code) may need to be configured (e.g., settings stored, data input, network addresses recorded, etc.) before the program code (or data to create the program code) can be executed/used in whole or in part. Thus, the disclosed Program code (or data to create the program code) are intended to encompass such machine readable instructions and/or program(s) (or data to create such machine readable instruction and/or programs) regardless of the particular format or state of the machine readable instructions and/or program(s) when stored or otherwise at rest or in transit.

Computer program code for carrying out operations of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

FIG. 10 illustrates an example computer-readable storage medium 1002 having instructions configured to implement all (or portion of) software implementations of applications 107, OS 109, user facing program 111, controller 120, EE 125 and ANN 126, as shown in FIG. 1, controller 620, EE 625 and ANN 626, as shown in FIG. 6, or memory controller 935 and EE 936 as shown in FIG. 9, and/or practice (aspects of) processes 300 of FIG. 3, 700 of FIG. 7, and 800 of FIG. 8, earlier described, in accordance with various embodiments. As illustrated, computer-readable storage medium 1002 may include the executable code of a number of programming instructions or bit streams 1004. Executable code of programming instructions (or bit streams) 1004 may be configured to enable a device, e.g., computer device 900, in response to execution of the executable code/programming instructions (or operation of an encoded hardware accelerator 905), to perform (aspects of) processes performed by applications 107, OS 109, user facing program 111, controller 120, EE 125 and ANN 126, as shown in FIG. 1, controller 620, EE 625 and ANN 626, as shown in FIG. 6, or memory controller 935 and EE 936 as shown in FIG. 9, and/or practice (aspects of) processes 300 of FIG. 3, 700 of FIG. 7, and 800 of FIG. 8. In alternate embodiments, executable code/programming instructions/bit streams 1004 may be disposed on multiple non-transitory computer-readable storage medium 1002 instead. In embodiments, computer-readable storage medium 1002 may be non-transitory. In still other embodiments, executable code/programming instructions 1004 may be encoded in transitory computer readable medium, such as signals.

Referring back to FIG. 9, for one embodiment, at least one of processors 902 may be packaged together with a computer-readable storage medium having some or all of computing logic 922 (in lieu of storing in system memory 904 and/or mass storage device 906) configured to practice all or selected ones of the operations earlier described with reference to FIGS. 3, 7 and 8. For one embodiment, at least one of processors 902 may be packaged together with a computer-readable storage medium having some or all of computing logic 922 to form a System in Package (SiP). For one embodiment, at least one of processors 902 may be integrated on the same die with a computer-readable storage medium having some or all of computing logic 922. For one embodiment, at least one of processors 902 may be packaged together with a computer-readable storage medium having some or all of computing logic 922 to form a System on Chip (SoC). For at least one embodiment, the SoC may be utilized in, e.g., but not limited to, a hybrid computing tablet/laptop.

Illustrative examples of the technologies disclosed herein are provided below. An embodiment of the technologies may include any one or more, and any combination of, the examples described below.

EXAMPLES

Example 1 is a memory controller (MC), comprising: an output interface, and an execution engine (EE) to: identify, based on field test results of an NVM die coupled to the MC, initial test results of the die using an artificial neural network (ANN) trained to identify the die from a set of NVM dies coupled to the MC based on initial test results of the set of NVM dies obtained at a time of manufacture of the set of dies, the initial test results of the die including a first useful life prediction and the field test results of the die including a second useful life prediction, wherein the initial test results of the die are regenerated by the ANN to protect their confidentiality; compare the second useful life prediction with the first useful life prediction, to determine, based on the comparison, a deviation between the two predictions, and output, via the output interface, the deviation to a user.

Example 2 is the MC of example 1, and/or any other example herein, wherein the set of NVM dies are from the same wafer.

Example 3 is the MC of example 1, and/or any other example herein, wherein the field test results and the initial test results respectively include results of a failure collection test (FCT) that mimics the lifespan of the NVM die's expected workload and collects a number of failures at a predefined number of memory cycles within a predefined time unit.

Example 4 is the MC of example 1, and/or any other example herein, wherein the ANN is a feed forward three-layer perceptron ANN.

Example 5 is the MC of example 1, and/or any other example herein, wherein the field test is a beginning of life (BOL) field test, performed when the NVM die has been put into use; and the EE is further to tune or adjust the ANN based on the results of the BOL field test.

Example 6 is the MC of example 1, and/or any other example herein, wherein the NVM die is one of a solid state device (SSD) or a dual in-line memory module (DIMM), and wherein the MC is integrated in the SSD or DIMM.

Example 7 is the MC of example 1, and/or any other example herein, wherein the first useful life prediction and the second useful life prediction respectively include a useful life plot, and wherein the deviation includes a direction and a magnitude of variance of the second useful life plot from the first useful life plot.

Example 8 is the MC of example 1, and/or any other example herein, wherein the EE is further to output, via the output interface, the deviation to a user if it exceeds a pre-defined threshold.

Example 9 is the MC of example 1, and/or any other example herein, wherein if no initial test results are identified for the NVM die, the EE is further to determine that the NVM die is not authentic, and report that to a user.

Example 10 is the MC of example 1, and/or any other example herein, wherein the EE is further to output, via the output interface, the second useful life prediction to the user.

Example 11 is one or more non-transitory computer-readable storage media comprising a set of instructions, which, when executed by a MC including an ANN trained to identify one NVM die out of a set of NVM dies coupled to the MC based on initial test results of the set of dies obtained at the time of manufacture of the set of dies, cause the MC to: identify, based on field test results of the die, initial test results of the die, the initial test results of the die including a first useful life prediction and the field test results of the die including a second useful life prediction; regenerate the initial test results of the die using the ANN; compare the second useful life prediction with the first useful life prediction, to determine, based on the comparison, a deviation between the two predictions; and output both the second useful life prediction and the deviation to a user.

Example 12 is the one or more non-transitory computer-readable storage media of example 11, and/or any other example herein, wherein the instructions, when executed, further cause the MC to perform a field test on the NVM die.

Example 13 is the one or more non-transitory computer-readable storage media of example 11, and/or any other example herein, wherein the field test is a BOL FT performed when the NVM die has been put into use, and wherein the instructions, when executed, further cause the MC to tune or adjust the ANN based on the results of the BOL FT.

Example 14 is the one or more non-transitory computer-readable storage media of example 11, and/or any other example herein, wherein the field test is a BOL FT, and wherein the instructions, when executed, further cause the MC to determine, if no ideal initial test results are identified for the NVM die, that the NVM die is not authentic, and report that to a user.

Example 15 is the one or more non-transitory computer-readable storage media of example 11, and/or any other example herein, wherein the first useful life prediction and the second useful life prediction respectively include a useful life plot, and wherein the deviation includes a direction and a magnitude of variance of the second useful life plot from the first useful life plot, and wherein the instructions, when executed, further cause the MC to: determine if the magnitude of the deviation exceeds a pre-defined threshold; and based on the determination, report the deviation to a user.

Example 16 is the one or more non-transitory computer-readable storage media of example 11, and/or any other example herein, wherein the instructions, when executed, further cause the MC to: identify, based on the deviation, if the NVM die is over cycled; and based on the identification, change wear-out levelling parameters for the NVM die.

Example 17 is a system, comprising: a DIMM including a set of NVM dies; and a MC, coupled to the set of NVM dies, including: an EE, to: identify, based on field test results of a NVM die, initial test results of the die using an ANN trained to identify the die from the set of NVM dies based on initial test results of the set of NVM dies obtained at a time of manufacture of the set of dies, the initial test results of the die including a first useful life prediction and the field test results of the die including a second useful life prediction, wherein the initial test results of the die are regenerated by the ANN to protect their confidentiality; compare the second useful life prediction with the first useful life prediction, to determine, based on the comparison, a deviation between the two predictions, and output the deviation to a user.

Example 18 is the system of example 16, and/or any other example herein, wherein the MC is integrated into the DIMM.

Example 19 is the system of example 16, and/or any other example herein, wherein the EE is further to: identify, based on the deviation, if the NVM die is over cycled; and based on the identification, change wear-out levelling parameters for the die.

Example 20 is the system of example 16, and/or any other example herein, wherein the initial test results and the field test results respectively include results of a failure collection test (FCT) that mimics the lifespan of the NVM die's expected workload and collects a number of failures at a predefined number of memory cycles within a predefined time unit.

Example 21 is the system of example 16, and/or any other example herein, wherein the EE is further to output the second useful life prediction to the user.

Example 22 is an apparatus, comprising: means for identifying, based on field test results of an NVM die coupled to the apparatus, initial test results of the die using an artificial neural network (ANN) trained to identify the die from a set of NVM dies coupled to the apparatus based on initial test results of the set of NVM dies obtained at a time of manufacture of the set of dies, the initial test results of the die including a first useful life prediction and the field test results of the die including a second useful life prediction; means for regenerating the initial test results of the die; means for comparing the second useful life prediction with the first useful life prediction; means for determining, based on the comparison, a deviation between the two predictions, and means for outputting the deviation to a user.

Example 23 is the apparatus of example 22, and/or any other example herein, wherein the set of NVM dies are from the same wafer.

Example 24 is the apparatus of example 22, and/or any other example herein, wherein the field test results and the initial test results respectively include results of a failure collection test (FCT) that mimics the lifespan of the NVM die's expected workload and collects a number of failures at a predefined number of memory cycles within a predefined time unit.

Example 25 is the apparatus of example 22, and/or any other example herein, wherein the ANN is a feed forward three-layer perceptron ANN.

Example 26 is the apparatus of example 22, and/or any other example herein, wherein the field test is a beginning of life (BOL) field test, performed when the NVM die has been put into use; and further comprising means for tuning or adjusting the ANN based on the results of the BOL field test.

Example 27 is the apparatus of example 22, and/or any other example herein, wherein the NVM die is one of a solid state device (SSD) or a dual in-line memory module (DIMM), and wherein the apparatus is integrated in the SSD or DIMM.

Example 28 is the apparatus of example 22, and/or any other example herein, wherein the first useful life prediction and the second useful life prediction respectively include a useful life plot, and wherein the deviation includes a direction and a magnitude of variance of the second useful life plot from the first useful life plot.

Example 29 is the apparatus of example 22, and/or any other example herein, wherein the EE is further to report the deviation to a user if it exceeds a pre-defined threshold.

Example 30 is the apparatus of example 22, and/or any other example herein, wherein if no initial test results are identified for the NVM die, further comprising means for determining that the NVM die is not authentic, and means for reporting the inauthenticity to a user.

Example 31 is the apparatus of example 22, and/or any other example herein, further comprising means for outputting the second useful life prediction to the user.

Example 32 is a method, comprising: identifying, based on field test results of an NVM die, initial test results of the NVM die using an artificial neural network (ANN) trained to identify the die from a set of NVM dies based on initial test results of the set of NVM dies obtained at a time of manufacture of the set of dies, the initial test results of the die including a first useful life prediction and the field test results of the die including a second useful life prediction, wherein the initial test results of the die are regenerated by the ANN to protect their confidentiality; comparing the second useful life prediction with the first useful life prediction, to determine, based on the comparison, a deviation between the two predictions; and outputting the deviation to a user.

Example 33 is the method of example 32, and/or any other example herein, The method of claim 21, further comprising: identifying, based on the deviation, if the NVM die is over cycled; and changing, based on the identification, wear-out levelling parameters for the die.

Example 34 is the method of claim 32, and/or any other example herein, wherein the field test results are BOL field test results, and further comprising: determining, if no initial test results are identified for the NVM die, that the NVM die is not authentic; and reporting the inauthenticity of the NVM die to a user.

What is claimed is:

1. A memory controller (MC), comprising:
an output interface; and
an execution engine (EE), coupled with the output interface, wherein the EE is to:
  identify initial test results of an non-volatile memory (NVM) die coupled to the MC, wherein the initial test results of the NVM die include a first useful life prediction of the NVM die, wherein to identify the initial test results includes to:
    access an artificial neural network (ANN) to identify the NVM die from a set of NVM dies coupled to the MC, wherein the ANN is to identify the NVM die using an initial test performed on the set of NVM dies at a time of manufacture of the set of NVM dies;
    perform a field test on the NVM die, during operation of the NVM die, to obtain field test results of the NVM die that include a second useful life prediction of the NVM die; and
    provide, with the ANN, the initial test results of the NVM die, which includes to recognize, with the ANN, a unique signature of the NVM die that is embodied in the results of the field test, and regenerate, with the ANN, the initial test results of the NVM die, based on the recognized signature of the NVM die;
  compare the second useful life prediction with the first useful life prediction, to determine, based on the comparison, a deviation between the two predictions; and
  output, via the output interface, the determined deviation.

2. The MC of claim 1, wherein the set of NVM dies are fabricated from a same wafer.

3. The MC of claim 1, wherein the field test results and the initial test results respectively include results of a failure collection test (FCT) that mimics a lifespan of the NVM die's expected workload and collects a number of failures at a predefined number of memory cycles within a predefined time unit.

4. The MC of claim 1, wherein the ANN is a feed forward three-layer perceptron ANN.

5. The MC of claim 1, wherein the field test is a beginning of life (BOL) field test, performed when the NVM die has been put into use; and the EE is further to tune or adjust the ANN based on the results of the BOL field test.

6. The MC of claim 1, wherein the NVM die is one of a solid state device (SSD) or a dual in-line memory module (DIMM), and wherein the MC is integrated in the SSD or DIMM.

7. The MC of claim 1, wherein the first useful life prediction and the second useful life prediction respectively include a useful life plot, and wherein the deviation includes a direction and a magnitude of variance of the second useful life plot from the first useful life plot.

8. The MC of claim 1, wherein the EE is further to output, via the output interface, the deviation to a user if it exceeds a pre-defined threshold.

9. The MC of claim 1, wherein if no initial test results are identified for the NVM die, the EE is further to determine that the NVM die is not authentic.

10. The MC of claim 1, wherein the EE is further to output, via the output interface, the second useful life prediction.

11. One or more non-transitory computer-readable storage media comprising a set of instructions, which, when executed by a microcontroller (MC) including an artificial neural network (ANN) trained to identify a non-volatile memory (NVM) die out of a set of NVM dies coupled to the MC based on initial test results of the set of dies obtained at a time of manufacture of the set of NVM dies, cause the MC to:
  identify initial test results of the NVM die, the initial test results of the die including a first useful life prediction of the NVM die, wherein to identify the initial test results includes to:
    access the ANN to identify the NVM die from the set of NVM dies coupled to the MC, wherein the ANN is to identify the NVM die using an initial test performed on the set of NVM dies at a time of manufacture of the set of NVM dies;
    perform a field test on the NVM die, during operation of the NVM die, to obtain field test results of the NVM die that include a second useful life prediction of the NVM die; and
    provide, with the ANN, the initial test results of the NVM die, which includes to recognize, with the ANN, a unique signature of the NVM die that is embodied in the results of the field test, and regenerate, with the ANN, the initial test results of the NVM die, based on the recognized signature of the NVM die; and compare the second useful life prediction with the first useful life prediction, to determine, based on the comparison, a deviation between the two predictions.

12. The one or more non-transitory computer-readable storage media of claim 11, wherein the field test (FT) is a beginning of life (BOL FT) performed when the NVM die has been put into use, and wherein the instructions, when executed, further cause the MC to tune or adjust the ANN based on the results of the BOL FT.

13. The one or more non-transitory computer-readable storage media of claim 11, wherein the field test (FT) is a beginning of life (BOL) FT, and wherein the instructions, when executed, further cause the MC to determine, if no initial test results are identified for the NVM die, that the NVM die is not authentic.

14. The one or more non-transitory computer-readable storage media of claim 11, wherein the first useful life prediction and the second useful life prediction respectively include a useful life plot, and wherein the deviation includes a direction and a magnitude of variance of the second useful life plot from the first useful life plot, and wherein the instructions, when executed, further cause the MC to:
   determine if the magnitude of the deviation exceeds a pre-defined threshold; and
   based on the determination, report the deviation to a user.

15. The one or more non-transitory computer-readable storage media of claim 11, wherein the instructions, when executed, further cause the MC to:
   identify, based on the deviation, if the NVM die is over cycled; and
   based on the identification, change wear-out levelling parameters for the NVM die.

16. A system, comprising:
   a dual in-line memory module (DIMM) including a set of non-volatile memory (NVM) dies; and
   a microcontroller (MC), coupled to the set of NVM dies, to:
   identify initial test results of the NVM die, wherein the initial test results of the NVM die include a first useful life prediction of the NVM die, wherein to identify the initial test results includes to:
   access an artificial neural network (ANN) to identify the NVM die from the set of NVM dies, wherein the ANN is to identify the NVM die using an initial test performed on the set of NVM dies at a time of manufacture of the set of NVM dies;
   perform a field test on the NVM die, during operation of the NVM die, to obtain the field test results of the die that include a second useful life prediction of the NVM die; and
      provide, with the ANN, the initial test results of the NVM die, which includes to recognize, with the ANN, a unique signature of the NVM die that is embodied in the results of the field test, and regenerate, with the ANN, the initial test results of the NVM die, based on the recognized signature of the NVM die; and
   compare the second useful life prediction with the first useful life prediction, to determine, based on the comparison, a deviation between the first and second useful life predictions.

17. The system of claim 16, wherein the MC is further to:
   identify, based on the deviation, if the NVM die is over cycled; and
   based on the identification, change wear-out levelling parameters for the NVM die.

18. The system of claim 16, wherein the initial test results and the field test results respectively include results of a failure collection test (FCT) that mimics the lifespan of the NVM die's expected workload and collects a number of failures at a predefined number of memory cycles within a predefined time unit.

19. The system of claim 16, wherein the MC is further to output the deviation between the first and second useful life predictions.

* * * * *